(12) United States Patent
Lee et al.

(10) Patent No.: US 12,225,756 B2
(45) Date of Patent: Feb. 11, 2025

(54) DISPLAY APPARATUS INCLUDING LOW REFLECTION AND REFLECTION ADJUSTING LAYERS

(71) Applicant: Samsung Display Co., Ltd., Yongin-si (KR)

(72) Inventors: Kyunghee Lee, Yongin-si (KR); Mihwa Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 384 days.

(21) Appl. No.: 17/677,129

(22) Filed: Feb. 22, 2022

(65) Prior Publication Data

US 2023/0031230 A1    Feb. 2, 2023

(30) Foreign Application Priority Data

Jul. 23, 2021  (KR) .................. 10-2021-0097180

(51) Int. Cl.
*H10K 50/84*     (2023.01)
*H10K 50/844*    (2023.01)
*H10K 50/85*     (2023.01)
*H10K 50/856*    (2023.01)
*H10K 59/12*     (2023.01)
*H10K 85/30*     (2023.01)
*H10K 59/121*    (2023.01)
*H10K 59/122*    (2023.01)
(Continued)

(52) U.S. Cl.
CPC ......... *H10K 50/844* (2023.02); *H10K 50/856* (2023.02); *H10K 85/311* (2023.02); *H10K 59/12* (2023.02); *H10K 59/1216* (2023.02); *H10K 59/122* (2023.02); *H10K 59/124* (2023.02); *H10K 59/126* (2023.02)

(58) Field of Classification Search
CPC .. H10K 50/844; H10K 50/856; H10K 50/865; H10K 50/8426; H10K 59/40; H10K 59/871; H10K 59/8492; H10K 59/873; H10K 59/122; H10K 59/1216; H10K 59/124; H10K 59/12; H10K 59/126; H10K 85/311; C09B 67/0033; C09D 7/20; C09D 201/00; C09J 7/20
See application file for complete search history.

(56) References Cited

U.S. PATENT DOCUMENTS

| 8,536,781 B2 | 9/2013 | Lee et al. |
| 10,347,700 B2 | 7/2019 | Yang et al. |
| 11,502,142 B2 * | 11/2022 | Lee ...................... H10K 59/879 |

(Continued)

FOREIGN PATENT DOCUMENTS

| KR | 10-1076262 | 10/2011 |
| KR | 10-2015-0101106 | 9/2015 |

(Continued)

*Primary Examiner* — Ida M Soward
(74) *Attorney, Agent, or Firm* — KILE PARK REED & HOUTTEMAN PLLC

(57) ABSTRACT

A display apparatus having improved reflectance includes at least one display element arranged on a substrate; a low reflection layer arranged on the display element and including an inorganic material; an encapsulation layer arranged on the low reflection layer and including a pigment and a first organic material; and a reflection adjusting layer arranged on the encapsulation layer and including a dye and a second organic material.

20 Claims, 12 Drawing Sheets

(51) Int. Cl.
*H10K 59/124* (2023.01)
*H10K 59/126* (2023.01)

(56) References Cited

U.S. PATENT DOCUMENTS

| | | | | |
|---|---|---|---|---|
| 2016/0079567 | A1* | 3/2016 | Cho | H10K 50/86 |
| | | | | 257/40 |
| 2019/0165074 | A1* | 5/2019 | Lee | H10K 59/126 |
| 2019/0189728 | A1* | 6/2019 | Lee | H10K 59/126 |
| 2019/0206945 | A1* | 7/2019 | Lin | H10K 59/8792 |
| 2019/0221767 | A1* | 7/2019 | Lee | H10K 59/126 |
| 2019/0355935 | A1* | 11/2019 | Jung | H10K 50/856 |
| 2020/0091247 | A1* | 3/2020 | Lee | G06F 3/044 |
| 2021/0005845 | A1* | 1/2021 | Kim | G06F 3/0446 |
| 2021/0104586 | A1* | 4/2021 | Baek | H01L 25/0753 |
| 2021/0104702 | A1* | 4/2021 | Jung | H10K 59/12 |
| 2021/0264823 | A1* | 8/2021 | Heo | H10K 59/879 |
| 2021/0384467 | A1* | 12/2021 | Park | H10K 59/877 |

FOREIGN PATENT DOCUMENTS

| | | | | |
|---|---|---|---|---|
| KR | 10-2017-0113822 | | 10/2017 | |
| KR | 10-1839787 | | 3/2018 | |
| KR | 10-2018-0050802 | | 5/2018 | |
| KR | 20210081945 A | * | 7/2021 | H10K 50/844 |

* cited by examiner

DISPLAY APPARATUS INCLUDING LOW REFLECTION AND REFLECTION ADJUSTING LAYERS

CROSS-REFERENCE TO RELATED APPLICATION(S)

This application is based on and claims priority to and the benefit of Korean Patent Application No. 10-2021-0097180 under 35 U.S.C. § 119, filed on Jul. 23, 2021, in the Korean Intellectual Property Office, the disclosure of which is incorporated by reference herein in its entirety.

BACKGROUND

1. Technical Field

One or more embodiments relate to a display apparatus, and more particularly, to a display apparatus having improved reflectance characteristics.

2. Description of Related Art

Among display apparatuses, organic light-emitting display apparatuses have wide viewing angles, excellent contrast, and fast response speeds, and thus have drawn attention as next-generation display apparatuses.

In general, organic light-emitting display apparatuses include a thin-film transistor and an organic light-emitting diode, which is a display element, formed on a substrate, and the organic light-emitting diode emits light by itself. Such organic light-emitting display apparatuses may be used as displays of small products such as mobile phones, or may be used as displays of large products such as televisions.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus having improved reflectance characteristics. However, the one or more embodiments are examples, and the scope of the disclosure is not limited thereto.

Additional aspects will be set forth in part in the description which follows and, in part, will be apparent from the description, or may be learned by practice of the embodiments of the disclosure.

According to one or more embodiments, a display apparatus includes at least one display element arranged on a substrate, a low reflection layer arranged on the display element and including an inorganic material, an encapsulation layer arranged on the low reflection layer and including a pigment and a first organic material, and a reflection adjusting layer arranged on the encapsulation layer and including a dye and a second organic material.

The pigment may be included in the encapsulation layer, and not included in the reflection adjusting layer.

The pigment may be insoluble in the first organic material.

The first organic material may include a base polymer having at least one of an acrylate group and an epoxy group.

The pigment may include at least one of C.I Pigment Red 177, C.I Pigment Green 7, C.I Pigment Green 59, C.I Pigment Yellow 185, and C.I Pigment Blue 15:6.

The dye may be included in the reflection adjusting layer, and not included in the reflection adjusting layer.

The dye may be soluble in the second organic material.

The inorganic material may include at least one of ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), and germanium (Ge).

The at least one display element may include a plurality of display elements, and the low reflection layer may be patterned to respectively correspond to the plurality of display elements.

The encapsulation layer may include at least one inorganic encapsulation layer and at least one organic encapsulation layer including the pigment and the first organic material.

The encapsulation layer may include an encapsulation substrate and a filling material including the pigment and the first organic material.

The reflection adjusting layer may absorb light in at least two wavelength regions among a first wavelength region, a second wavelength region, a third wavelength region, and a fourth wavelength region, each having a different wavelength band.

The first wavelength region may be in a range of about 350 nm to about 430 nm, the second wavelength region may be in a range of about 480 nm to about 510 nm, the third wavelength region may be in a range of about 575 nm to about 605 nm, and the fourth wavelength region may be in a range of about 650 nm to about 700 nm.

The reflection adjusting layer may absorb light in the second wavelength region and light in the third wavelength region.

The reflection adjusting layer may include at least two dyes among a first dye absorbing light in the first wavelength region, a second dye absorbing light in the second wavelength region, a third dye absorbing light in the third wavelength region, and a fourth dye absorbing light in the fourth wavelength region.

The first dye may include at least one a metal porphyrin compound, a methine compound, and a triazine compound.

The second dye may include a pyrromethene compound.

The third dye may include a tetra-azaporphyrin compound.

The fourth dye may include a phthalocyanine compound.

An amount of each of the dyes in the reflection adjusting layer may be in a range of about 0.005 wt % to about 0.5 wt %.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
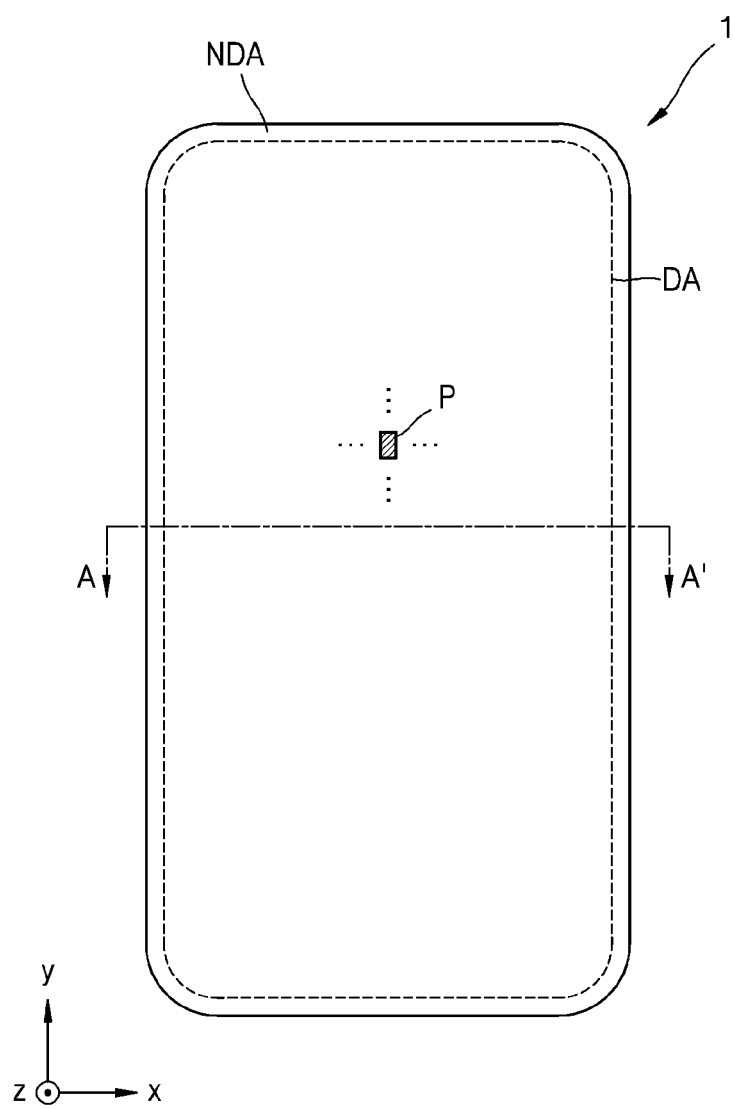
FIG. 1 is a schematic plan view of a portion of a display apparatus according to an embodiment.

Embodiments of the disclosure will be described hereinafter with reference to the accompanying drawings. Although the embodiments may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

Some of the parts which are not associated with the description may not be provided in order to describe embodiments of the disclosure and like reference numerals refer to like elements throughout the specification.

It will be understood that although the terms "first," "second," "third," or the like may be used herein to describe various elements, these elements should not be limited by these terms. These elements are used to distinguish one element from another element of for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

As used herein, the singular forms "a," "an," and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

It will be understood that when the terms "comprises," "comprising," "includes," "including," "has" and/or "having" are used in the specification, they or it may specify the presence of stated features, integers, steps, operations, elements and/or components, but do not preclude the presence or addition of other features, integers, steps, operations, elements, components, and/or any combination thereof.

When a layer, film, region, substrate, area, or component, is referred to as being "on" or "onto" another layer, film, region, substrate, area, or component, it may be directly on the other layer, film, region, substrate, area, or component, or intervening layers, films, regions, substrates, areas, or components may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" or "coupled" to another element, the element may be "directly connected" or "directly coupled" to another element, or "electrically connected" or "electrically coupled" to another element with one or more intervening elements interposed therebetween.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B (or, e.g., any combination thereof)."

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another. Further, in the specification, the phrase "in a plan view" means when an object portion is viewed from above, and the phrase "in a cross-sectional view" means when a cross-section taken by vertically cutting an object portion is viewed from the side.

When a certain embodiment may be implemented differently, a specific process order may be performed differently from the described order. For example, two consecutively described processes may be performed substantially at the same time or may be performed in an order opposite to the described order.

In the drawings, sizes and thicknesses of elements may be enlarged for clarity and ease of description thereof. However, the disclosure is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated, but the following embodiments are not limited thereto.

Unless otherwise defined or implied herein, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view of a portion of a display apparatus 1 according to an embodiment.

Referring to FIG. 1, the display apparatus 1 may include a display area DA and a peripheral area NDA disposed outside the display area DA. Pixels P may be arranged in the display area DA, and the display apparatus 1 may provide (or display) an image by using light emitted by the pixels P arranged in the display area DA. Each of the pixels P may include a display element. The peripheral area NDA may be a non-display area in which display element is not arranged, and the peripheral area NDA may surround (e.g., entirely surround) the display area DA. For example, the display apparatus 1 may have a short side arranged in an x-axis direction 'x' and a long side arranged in a y-axis direction 'y'.

Although FIG. 1 illustrates the display apparatus 1 including a flat display surface, embodiments of the disclosure are not limited thereto. In another embodiment, the display apparatus 1 may include a three-dimensional display surface or a curved display surface.

In case that the display apparatus 1 includes the three-dimensional display surface, the display apparatus 1 may include display areas pointing in different directions, and may include, for example, polygonal columnar display surfaces. In another embodiment, in case that the display apparatus 1 includes the curved display surface, the display apparatus 1 may be implemented in various forms such as flexible, foldable, or rollable display apparatuses.

In an embodiment, FIG. 1 illustrates a display apparatus 1 that is applicable to mobile phone terminals. Although not shown in the drawings, electronic modules, a camera module, a power module, and the like may be mounted on a main board, which may be arranged in a bracket/case or the like, and the display apparatus 1 and the main board may be implemented with a mobile phone terminal. The display apparatus 1 according to an embodiment may be applicable to large-sized electronic devices such as televisions, monitors, or the like and small/medium-sized electronic devices such as tablets, automobile navigation devices, game consoles, smart watches, or the like.

The display area DA of the display apparatus 1 of FIG. 1 has a rectangular shape with round corners. However, in another embodiment, the display area DA may have a circular shape, an oval shape, or a polygonal shape such as a triangular shape or a pentagonal shape.

Hereinafter, an organic light-emitting display apparatus is provided below as the display apparatus 1 according to an embodiment, but display apparatuses according to the disclosure are not limited thereto. In another embodiment, the display apparatus 1 according to an embodiment may be an inorganic light-emitting display apparatus, a quantum dot light-emitting display apparatus, or the like. For example, an emission layer of a display element included in the display apparatus 1 may include an organic material, an inorganic material, quantum dots, a combination of an organic material and quantum dots, or a combination of an inorganic material and quantum dots.

Figure 2:
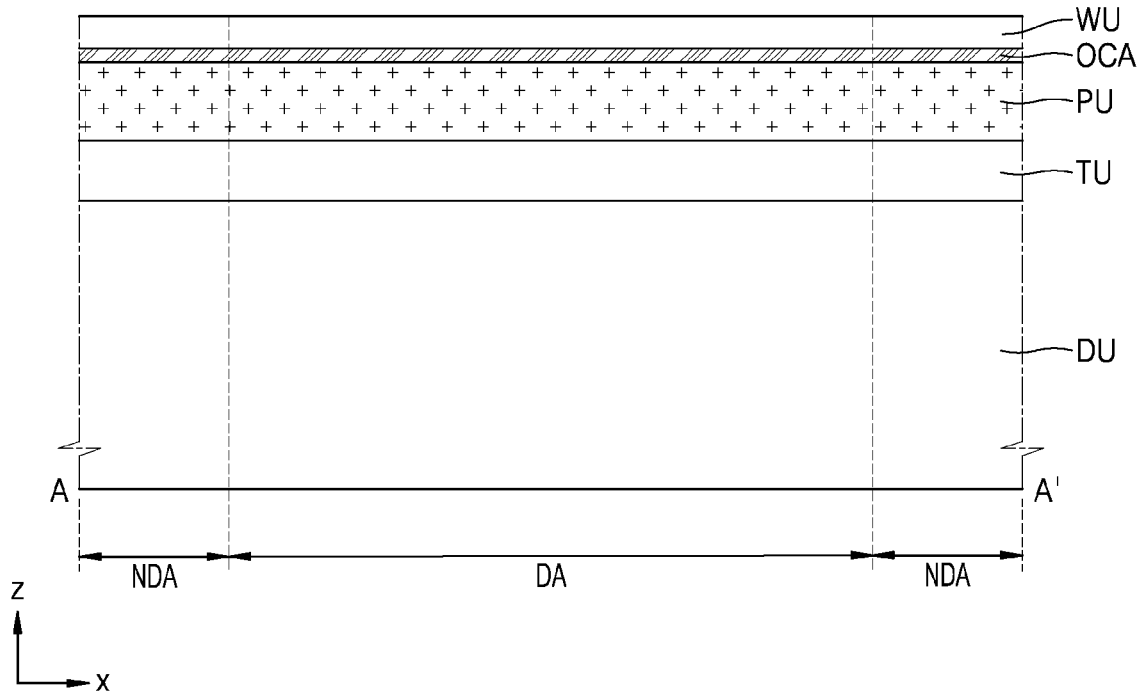
FIG. 2 is a schematic cross-sectional view of the display apparatus of FIG. 1 taken along line A-A' of FIG. 1.
Figure 3A:
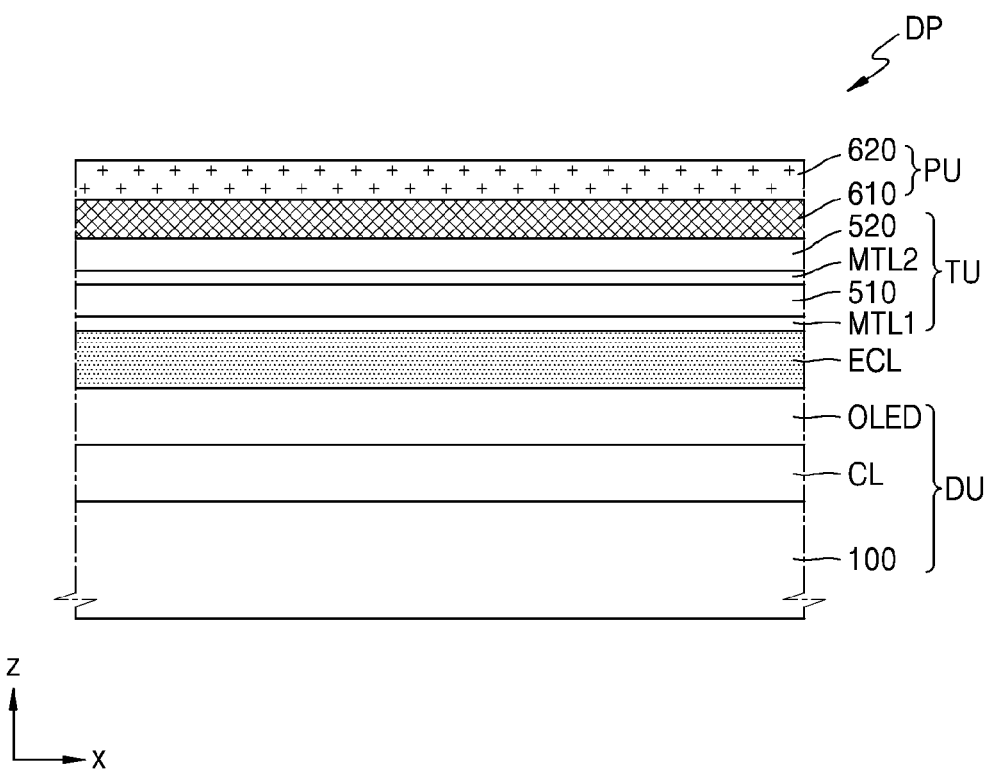
FIGS. 3A and 3B are schematic cross-sectional views of a portion of the display apparatus of FIG. 2 according to embodiments.
Figure 3B:
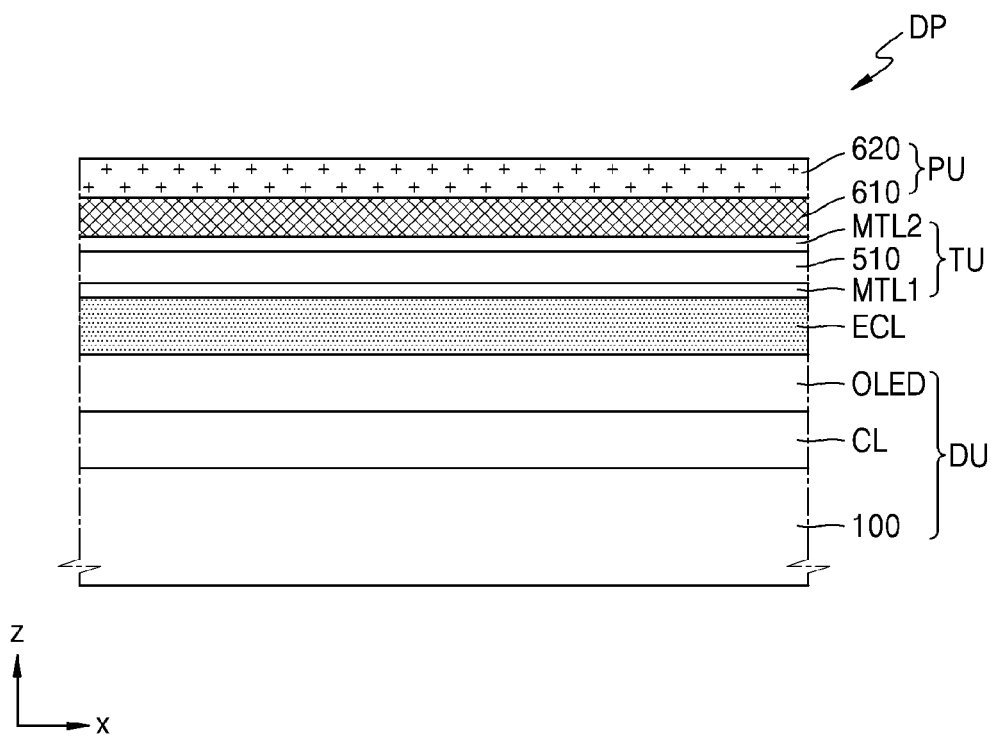

FIG. 2 is a schematic cross-sectional view of the display apparatus 1 of FIG. 1 taken along line A-A' of FIG. 1. FIG. 3A is a schematic cross-sectional view of a portion of the display apparatus 1 of FIG. 2. FIG. 3B is a schematic cross-sectional view of a portion of a display apparatus according to an embodiment.

Referring to FIG. 2, the display apparatus 1 (e.g., refer to FIG. 1) according to an embodiment may include a display layer DU, an input sensing layer TU, an anti-reflection layer PU, and a window layer WU. For example, the display layer DU, the input sensing layer TU, the anti-reflection layer PU, and the window layer WU of the display apparatus 1 (e.g., refer to FIG. 1) may be disposed in the display area DA and the peripheral area NDA disposed outside the display area DA. At least some components (e.g., layers) among the display layer DU, the input sensing layer TU, the anti-reflection layer PU, and the window layer WU may be formed by a continuous process (or continuous processes), or may be combined with each other through an adhesive member. For example, at least two of the display layer DU, the input sensing layer TU, the anti-reflection layer PU, and the window layer WU may be continuously (or sequentially) formed. FIG. 2 illustrates an optically clear adhesive member (or transparent adhesive member) OCA as the adhesive member. The adhesive member described below may include an adhesive of the related art. In an embodiment, the window layer WU may be replaced by another component (e.g., a cover plate, a protection layer, or the like). The window layer WU may be omitted.

In an embodiment, the input sensing layer TU may be arranged (e.g., directly arranged) on the display layer DU. As used herein, the expression "a component B is arranged (e.g., directly arranged) on a component A" means that there is no adhesive layer/member arranged between the component A and the component B. The component A may be provided on a base surface, and the component B may be formed on the component A through continuous processes after the component A is formed.

The display layer DU, the input sensing layer TU arranged (e.g., directly arranged) on the display layer DU, and the anti-reflection layer PU may be defined as or implemented with, for example, a display panel DP (e.g., refer to FIG. 3A). The optically clear adhesive member OCA may be arranged between the display panel DP (e.g., refer to FIG. 3A) and the window layer WU.

The display layer DU may generate an image, and the input sensing layer TU may obtain (or sense) coordinate information of an external input (e.g., touch event). Although not shown in the drawings, the display panel DP (e.g., refer to FIG. 3A) according to an embodiment may further include a protective member (not shown) arranged on (or disposed on) a lower surface of the display layer DU. The protective member (not shown) and the display layer DU may be combined with each other through an adhesive member (not shown).

In an embodiment, the display panel DP (e.g., refer to FIG. 3A) may further include an optical functional layer (not shown) on the input sensing layer TU. The optical functional layer (not shown) may improve light efficiency. The optical functional layer (not shown) may improve, for example, front light efficiency (e.g., front brightness) and/or side visibility (e.g., viewing angle) of light emitted by a display element OLED (e.g., refer to FIG. 3A).

The anti-reflection layer PU may reduce reflectance of external light that is incident thereinto from an upper side of the window layer WU. The anti-reflection layer PU may absorb, for example, at least part of wavelength region (e.g., non-display wavelength region) of the incident external light.

Hereinafter, structures of the display layer DU, the input sensing layer TU, and the anti-reflection layer PU is provided below with reference to FIGS. 3A and 3B.

In FIGS. 3A and 3B, the display layer DU is simply illustrated to describe a stacking relationship between the input sensing layer TU and the anti-reflection layer PU. For example, the window layer WU (e.g., refer to FIG. 2) and the optically clear adhesive member OCA (e.g., refer to FIG. 2) that may be arranged on (or disposed on) the anti-reflection layer PU are not shown.

Referring to FIGS. 3A and 3B, in the display layer DU, a circuit layer CL, a display element OLED, and an encapsulation layer ECL may be sequentially arranged on (or disposed on) a substrate 100. In an embodiment, the encapsulation layer ECL may include at least one organic encapsulation layer 420 (e.g., refer to FIG. 5), and provide a flat surface. Description of the organic encapsulation layer 420 is provided below with reference to FIG. 5. In another embodiment, the encapsulation layer ECL may include an encapsulation substrate 450 (e.g., refer to FIG. 7), and provide a flat surface. Description of the encapsulation substrate 450 is provided below with reference to FIG. 7. Accordingly, even in case that the components of the input sensing layer TU described below are formed by continuous processes, a defective rate may be reduced.

The input sensing layer TU may have a multi-layer structure (or multiple layers). The input sensing layer TU may include a sensing electrode, a signal line (or trace line) connected (e.g., electrically connected) to the sensing electrode, and at least one insulating layer. The input sensing layer TU may sense an external input according to, for example, an electrostatic capacitive method. An operating method of the input sensing layer TU is not limited thereto. In an embodiment, the input sensing layer TU may sense an external input according to an electromagnetic induction method or a pressure sensing method.

As shown in FIG. 3A, the input sensing layer TU according to an embodiment may include a first conductive layer MTL1, a first insulating layer 510, a second conductive layer MTL2, and a second insulating layer 520.

For example, each of the first conductive layer MTL1 and the second conductive layer MTL2 may have a single-layer structure or a stacked multi-layer structure (or multiple layers). The conductive layer (e.g., first conductive layer MTL1 and/or second conductive layer MTL2) having the single-layer structure may include a metal layer or a transparent conductive layer. The metal layer of the conductive layer (e.g., first conductive layer MTL1 and/or second conductive layer MTL2) may include at least one of molybdenum, silver, titanium, copper, aluminum, and an alloy thereof. The transparent conductive layer of the conductive layer (e.g., first conductive layer MTL1 and/or second conductive layer MTL2) may include a transparent conductive oxide such as indium tin oxide (ITO), indium zinc oxide (IZO), zinc oxide (ZnO), indium tin zinc oxide (ITZO), or the like. For example, the transparent conductive layer may include a conductive polymer such as poly(3,4-ethylenedioxythiphene) (PEDOT), metal nanowires, graphene, or the like.

The conductive layer (e.g., first conductive layer MTL1 or second conductive layer MTL2) having the multi-layer structure (or multiple layers) may include metal layers. The metal layers may have, for example, a three-layer structure of Ti/Al/Ti. The conductive layer (e.g., first conductive layer MTL1 or second conductive layer MTL2) having the multi-layer structure (or multiple layers) may include at least one metal layer and at least one transparent conductive layer.

Each of the first conductive layer MTL1 and the second conductive layer MTL2 may include patterns. For example, the first conductive layer MTL1 may include first conductive patterns, and that the second conductive layer MTL2 may include second conductive patterns. The first conductive patterns and the second conductive patterns may form a sensing electrode shown in FIG. 5.

The first insulating layer 510 may have a single-layer or multi-layer structure (or multiple layers). The first insulating layer 510 may include an inorganic material or a composite material (e.g., combination of at least two materials or mixture thereof). For example, the first insulating layer 510 may include an inorganic layer. The inorganic layer of the first insulating layer 510 may include at least one of aluminum oxide, titanium oxide, silicon oxide, silicon oxynitride, silicon nitride, zirconium oxide, and hafnium oxide. In another embodiment, the first insulating layer 510 may be replaced by (or include) an organic insulating layer.

The second insulating layer 520 may have a single-layer or multi-layer structure (or multiple layers). The second insulating layer 520 may include an inorganic material or an organic material. For example, examples of the inorganic material of the second insulating layer 520 may include at least one material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material of the second insulating layer 520 may include at least one material selected from the group consisting of an acryl-based resin, a methacryl-based resin, polyisoprene, a vinyl-based resin, an epoxy-based resin, a urethane-based resin, a cellulose-based resin, and a perylene-based resin.

In another embodiment, as shown in FIG. 3B, a display panel DP may not have a second insulating layer 520 (refer to FIG. 3A). For example, the second insulating layer 520 (refer to FIG. 3A) may be omitted. The display panel DP of FIG. 3B is different from the display panel DP of FIG. 3A in that the second insulating layer 520 is omitted. Thus, detailed description of the same constituent element is omitted. An anti-reflection layer PU may be arranged (e.g., directly arranged) on an input sensing layer TU. For example, a light blocking layer 610 of the anti-reflection layer PU may be arranged (e.g., directly arranged) on a second conductive layer MTL2 of the input sensing layer TU.

Referring again to FIGS. 3A and 3B, the anti-reflection layer PU may include the light blocking layer 610 and a reflection adjusting layer 620.

In an embodiment, the light blocking layer 610 may include a light blocking material, and may have a black color. The light blocking material of the light blocking layer 610 may include carbon black, carbon nanotubes, a resin or paste including a black dye, metal particles (e.g., nickel, aluminum, molybdenum, and alloy thereof), metal oxide particles (e.g., chromium oxide), or metal nitride particles (e.g., chromium nitride). In case that the light blocking layer 610 includes the light blocking material, structures arranged under (or disposed under) the light blocking layer 610 may reduce reflection of external light.

The reflection adjusting layer 620 may be arranged on (or disposed on) the light blocking layer 610. In case that external light incident on an upper surface of the display panel DP is reflected by the structures arranged under the anti-reflection layer PU, the reflection adjusting layer 620 may absorb at least part of wavelength region (e.g., non-display wavelength region) of the reflected light.

Figure 4:
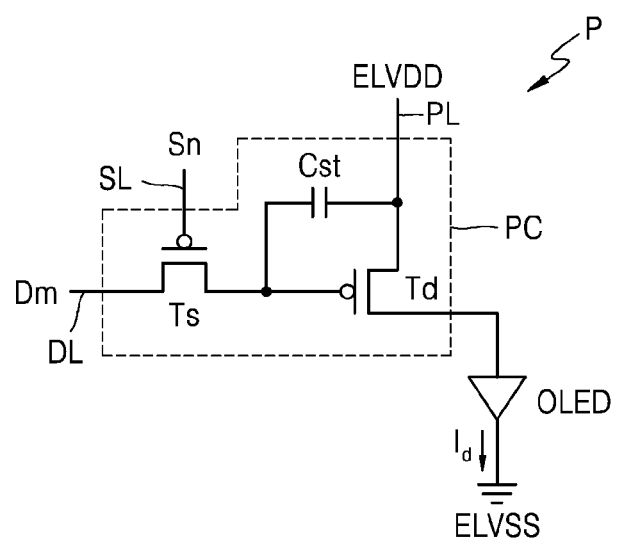
FIG. 4 is a schematic diagram of an equivalent circuit of a pixel included in a display apparatus according to an embodiment.

FIG. 4 is a schematic diagram of an equivalent circuit of a pixel P included in the display apparatus 1 according to an embodiment.

Referring to FIG. 4, each pixel P may include a pixel circuit PC and a display element OLED. The pixel circuit PC may be connected (e.g., electrically connected) to a scan line SL and a data line DL. The display element OLED may be connected (e.g., electrically connected) to the pixel circuit PC.

The pixel circuit PC may include a driving thin-film transistor Td, a switching thin-film transistor Ts, and a storage capacitor Cst. The switching thin-film transistor Ts may be connected (e.g., electrically connected) to the scan line SL and the data line DL, and transmit a data signal Dm to the driving thin-film transistor Td according to a scan signal Sn. The data signal Dm may be applied to the driving thin-film transistor Td through the data line DL and the switching transistor Ts according to the scan signal Sn. The scan signal Sn may be applied to the switching transistor Ts through the scan line SL.

The storage capacitor Cst may be connected (e.g., electrically connected) to the switching thin-film transistor Ts and a driving voltage line PL, and store a voltage corresponding to a difference between a voltage received from (or output from) the switching thin-film transistor Ts and a driving voltage ELVDD supplied to the driving voltage line PL.

The driving thin-film transistor Td may be connected (e.g., electrically connected) to the driving voltage line PL and the storage capacitor Cst, and may control a driving current $I_d$ flowing from the driving voltage line PL to the display element OLED, in accordance with a voltage value (e.g., electrical energy) stored in the storage capacitor Cst. The display element OLED may emit light having a certain luminance according to the driving current $I_d$.

Although FIG. 4 illustrates the pixel circuit PC including two thin-film transistors and one storage capacitor, embodiments of the disclosure are not limited thereto. In another embodiment, the pixel circuit PC may include seven thin-film transistors and one storage capacitor. In another embodiment, the pixel circuit PC may include two or more storage capacitors.

Figure 5:
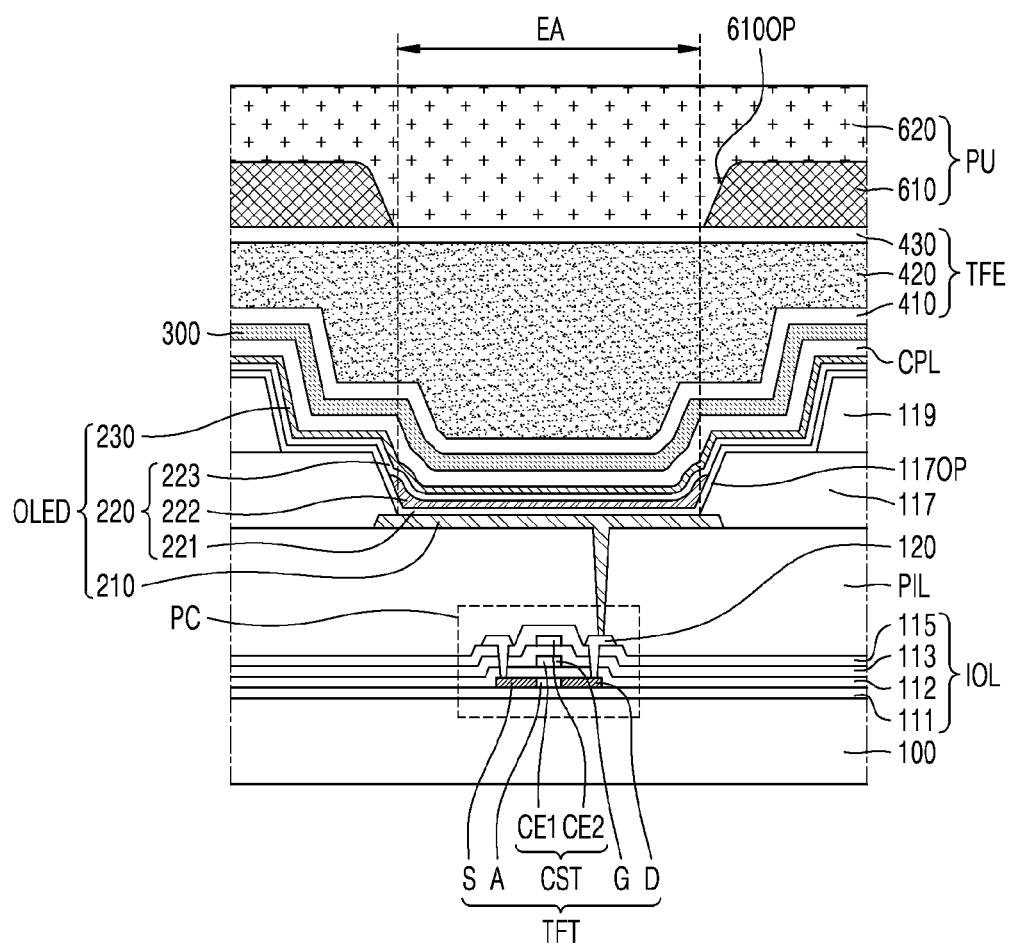
FIGS. 5 and 6 are schematic cross-sectional views of a display apparatus according to embodiments.

FIG. 5 is a schematic cross-sectional view of a display apparatus according to an embodiment.

First, a structure of a display panel DP (e.g., refer to FIG. 3A) is provided below with reference to FIG. 5.

The display panel DP (e.g., refer to FIG. 3A) may include a substrate 100, a display element OLED arranged on (or disposed on) the substrate 100, a low reflection layer 300 arranged on (or disposed on) the display element OLED, and a thin-film encapsulation layer TFE arranged on (or disposed on) the low reflection layer 300, and an anti-reflection layer PU arranged on (or disposed on) the thin-film encapsulation layer TFE.

The substrate 100 may be formed of a material such as a glass material, a metal, or an organic material. In an embodiment, the substrate 100 may be formed of a flexible material. For example, the substrate 100 may include at least one polymer resin of polyethersulfone, polyacrylate, polyetherimide, polyethylene naphthalate, polyethylene terephthalate, polyphenylene sulfide, polyarylate, polyimide, polycarbonate, and cellulose acetate propionate.

Various modifications may be made to the substrate 100. For example, the substrate 100 may have a multi-layer structure (or multiple layers) including two layers (e.g., polymer layers) each including the polymer resin and a barrier layer arranged between the two layers (e.g., polymer layers). The barrier layer of the substrate 100 may include an inorganic material (e.g., silicon oxide, silicon nitride, silicon oxynitride, amorphous silicon, or the like).

A buffer layer 111 may be arranged on (or disposed on) the substrate 100. The buffer layer 111 may prevent impurities from entering various devices arranged on (or disposed on) the substrate 100 through the substrate 100. For example, the buffer layer 111 may prevent the impurities from being permeated thereinto to protect the elements disposed on the substrate 100.

A pixel circuit PC including a thin-film transistor TFT and a storage capacitor Cst may be arranged on (or disposed on) the buffer layer 111. The thin-film transistor TFT may include a semiconductor layer A, a gate electrode G overlapping a channel region of the semiconductor layer A in a plan view, and an electrode layer 120 disposed on the gate electrode G. The electrode layer 120 may include a source electrode and a drain electrode. The source electrode and the drain electrode of the electrode layer may be connected (e.g., electrically connected) to a source region S and a drain region D of the semiconductor layer A, respectively. A gate insulating layer 112 may be arranged between the semiconductor layer A and the gate electrode G, and a first interlayer insulating layer 113 and a second interlayer insulating layer 115 may be arranged between the gate electrode G and the electrode layer 120.

The storage capacitor Cst may overlap the thin-film transistor TFT in a plan view. The storage capacitor Cst may include a first capacitor plate CE1 and a second capacitor plate CE2 overlapping each other in a plan view. In an embodiment, the gate electrode G of the thin-film transistor TFT and the first capacitor plate CE1 of the storage capacitor Cst may be integral with each other. The first interlayer insulating layer 113 may be arranged between the first capacitor plate CE1 and the second capacitor plate CE2.

The semiconductor layer A may include a channel region, a source region, and a drain region. The source region and the drain region may be doped with a large amount of impurities. In an embodiment, the semiconductor layer A may include a silicon semiconductor material. In an embodiment, the semiconductor layer A may include polysilicon or amorphous silicon. In an embodiment, the semiconductor layer A may include an oxide semiconductor material. In an embodiment, the pixel circuit PC may include thin-film transistors TFT. Some of the thin-film transistors TFT of the pixel circuit PC may include a silicon semiconductor material, and another of the thin-film transistors TFT may include an oxide semiconductor material. In case that the semiconductor layer A includes the oxide semiconductor material, the semiconductor layer A may include at least one material selected from the group consisting of indium (In), gallium (Ga), tin (Sn), zirconium (Zr), hafnium (Hf), titanium (Ti), zinc (Zn), and an alloy thereof.

The gate insulating layer 112 may include at least one inorganic insulating material of silicon oxide, silicon oxynitride, and silicon nitride. The gate insulating layer 112 may have a single-layer or a multi-layer structure (or multiple layers) including the above-described material.

The gate electrode G and/or the first capacitor plate CE1 may include at least one low-resistance conductive material of Mo, Al, Cu, Ti, and an alloy thereof. The gate electrode G and/or the first capacitor plate CE1 may have a single-layer or multi-layer structure (or multiple layers) including the above-described material.

The first interlayer insulating layer 113 may include at least one inorganic insulating material of silicon oxide, silicon oxynitride, and silicon nitride. The first interlayer insulating layer 113 may have a single-layer or multi-layer structure (or multiple layers) including the above-described material.

The second capacitor plate CE2 may include at least one of Al, Cr, Mo, Ti, W, copper (Cu), and an alloy thereof. The second capacitor plate CE2 may have a single-layer or multi-layer structure (or multiple layers) including the above-described material.

The second interlayer insulating layer 115 may include at least one inorganic insulating material of silicon oxide, silicon oxynitride, and silicon nitride. The second interlayer insulating layer 115 may have a single-layer or multi-layer structure (or multiple layers) including the above-described material.

The electrode layer 120 may include at least one of Al, Mo, Ti, W, Cu, and an alloy thereof. The electrode layer 120 may have a single-layer or multi-layer structure (or multiple layers) including the above-described material. For example, the electrode layer 120 may have a three-layer structure of Ti layer/Al layer/Ti layer.

A planarization insulating layer PIL may be arranged on (or disposed on) the pixel circuit PC. The planarization insulating layer PIL may have a single-layer or multi-layer structure (or multiple layers). The planarization insulating layer PIL may have an upper surface planarized through chemical mechanical polishing. For example, the upper surface of the planarization insulating layer PIL may be flat.

The planarization insulating layer PIL may include different material from at least one layer in inorganic insulating layers IOL. For example, the inorganic insulating layers IOL may include the buffer layer 111, the gate insulating layer 112, the first interlayer insulating layer 113, and the second interlayer insulating layer 115. The planarization insulating layer PIL may include an organic insulating material such as a general-purpose polymer, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like. For example, the general-purpose polymer of the organic insulating material of the planarization insulating layer PIL may include such as photosensitive polyimide, polyimide, polycarbonate (PC), benzocyclobutene (BCB), hexamethyldisiloxane (HMDSO), polymethylmethacrylate (PMMA), polystyrene (PS), or the like.

A pixel electrode 210 may be arranged on (or disposed on) the planarization insulating layer PIL. The pixel electrode 210 may include a reflective layer including at least one of silver (Ag), magnesium (Mg), Al, Pt, palladium (Pd), gold (Au), nickel (Ni), neodymium (Nd), iridium (Ir), Cr, and an alloy thereof. The pixel electrode 210 may include the reflective layer including the above-described material, and a transparent conductive layer arranged above or/and below the reflective layer. The transparent conductive layer of the pixel electrode 210 may include indium tin oxide (ITO), indium zinc oxide (IZO), zinc oxide (ZnO), indium oxide ($In_2O_3$), indium gallium oxide (IGO), aluminum zinc oxide (AZO), or other suitable transparent conductive material. In an embodiment, the pixel electrode 210 may have a three-layer structure of ITO layer/Ag layer/ITO layer that are sequentially stacked.

A pixel defining layer 117 may cover (or overlap) an edge of the pixel electrode 210, and may include an opening 117OP that exposes a center of the pixel electrode 210. The pixel defining layer 117 may include an organic insulating material such as BCB, polyimide, HMDSO, or the like. An emission area EA may be defined via the opening 117OP of the pixel defining layer 117, and a color light (e.g., red, green, or blue light) may be emitted from the emission area EA. An area or width of the emission area EA may define an area or width of a pixel P (e.g., refer to FIG. 4).

The pixel defining layer 117 may have a black color. The pixel defining layer 117 may include a light blocking material having a black color. The light blocking material of the pixel defining layer 117 may include carbon black, carbon nanotubes, a resin or paste including a black dye, metal particles (e.g., nickel, Al, Mo, or an alloy thereof), metal oxide particles (e.g., chromium oxide), or metal nitride particles (e.g., chromium nitride). In case that the pixel defining layer 117 includes the light blocking material, external light reflection due to metal structures arranged under the pixel defining layer 117 may be reduced. For example, the external light reflected from the metal structures arranged under the pixel defining layer 117 may be invisible by the light blocking material.

A spacer 119 may be formed on the pixel defining layer 117. The spacer 119 may prevent layers (e.g., pixel defining layer 117, pixel electrode 210, or the like) disposed below the spacer 119 from being damaged by a mask in a subsequent process of forming an intermediate layer 220. For example, the spacer 119 may protect the layers (e.g., pixel defining layer 117, pixel electrode 210, or the like) from impact or scratch caused by the mask used in the subsequent process. Thus, yield of the pixel P (e.g., refer to FIG. 4) may be reduced. Description of the intermediate layer 220 is provided below. In an embodiment, the spacer 119 may include a same material as that of the pixel defining layer 117. In another embodiment, the spacer 119 may include different material from that of the pixel defining layer 117. For example, in case that the spacer 119 includes the same material as that of the pixel defining layer 117, the spacer 119 and the pixel defining layer 117 may be integral with each other, and formed through a half-tone mask. In case that the pixel defining layer 117 is formed with a black color, the spacer 119 may also be formed with a black color.

The intermediate layer 220 may include an emission layer 222 overlapping the pixel electrode 210 in a plan view. The emission layer 222 may include an organic material. The emission layer 222 may include a high-molecular weight organic material or a low-molecular weight organic material for emitting light of a color. As described above, the emission layer 222 may be formed through a deposition process using a mask.

A first functional layer 221 and a second functional layer 223 may be arranged below and/or above the emission layer 222, respectively. In an embodiment, the emission layer 222 may be patterned and arranged for each pixel P (e.g., refer to FIG. 1). However, the first functional layer 221 and the second functional layer 223 may be integral with each other, and provided over the entire surface of the display area DA (e.g., refer to FIG. 1). For example, the first functional layer 221 and the second functional layer 223 may be provided over multiple pixels P (e.g., refer to FIG. 1) adjacent to each other or cover the entire pixels P (e.g., refer to FIG. 1) in a plan view.

The first functional layer 221 may include a single layer or multiple layers. For example, in case that the first functional layer 221 is formed of the high-molecular weight material, the first functional layer 221 may be a hole transport layer (HTL) having a single-layer structure, and may be formed of PEDOT or polyaniline (PANI). In case that the first functional layer 221 is formed of the low-molecular weight material, the first functional layer 221 may include a hole injection layer (HIL) and an HTL.

The second functional layer 223 may be optionally arranged (or may be omitted). For example, in case that the first functional layer 221 and the emission layer 222 are formed of the high-molecular weight material, the second functional layer 223 may be formed thereon. The second functional layer 223 may include a single layer or multiple layers. The second functional layer 223 may include an electron transport layer (ETL) and/or an electron injection layer (EIL).

An opposite electrode 230 may be disposed on the intermediate layer 220, and include a conductive material having a relatively low work function. For example, the opposite electrode 230 may include a transparent layer (or semi-transparent layer) including at least one of silver (Ag), Mg, Al, Ni, Cr, lithium (Li), calcium (Ca), and an alloy thereof. In another example, the opposite electrode 230 may further include a layer such as ITO, IZO, ZnO, or $In_2O_3$ on the transparent layer (or semi-transparent layer) including the above-described material. In an embodiment, the opposite electrode 230 may include at least one of Ag, Mg, and an alloy thereof.

The pixel electrode 210, the intermediate layer 220, and the opposite electrode 230 may be sequentially stacked. The stacked structure of the pixel electrode 210, the intermediate layer 220, and the opposite electrode 230 may form a light-emitting diode OLED.

In an embodiment, a capping layer CPL may be arranged on (or disposed on) the display element OLED. The capping layer CPL may improve emission efficiency of the display element OLED. For example, the emission efficiency of the display element OLED may be improved according to the principle of constructive interference. However, the disclosure is not limited thereto. In an embodiment, the capping layer CPL may include a material having a refractive index of about 1.6 or more with respect to light having a wavelength of about 589 nm.

The capping layer CPL may be an organic capping layer including an organic material, an inorganic capping layer including an inorganic material, or a composite capping layer including a combination or mixture of an organic material and an inorganic material. For example, the capping layer CPL may include at least one of a carbocyclic compound, a heterocyclic compound, an amine group-containing compound, porphine derivatives, porphyrin derivatives, phthalocyanine derivatives, naphthalocyanine derivatives, an alkali metal complex, and an alkaline earth metal complex. The carbocyclic compound, the heterocyclic compound, and the amine group-containing compound may be optionally or selectively substituted with a substituent including at least one of oxygen (O), nitrogen (N), sulfur (S), selenium (Se), silicon (Si), fluorine (F), chlorine (Cl), bromine (Br), and iodine (I).

In an embodiment, the low reflection layer 300 may be arranged on (or disposed on) the capping layer CPL. In another embodiment, the capping layer CPL may be omitted, and the low reflection layer 300 may be arranged on (or disposed on) the display element OLED without the capping layer CPL.

In an embodiment, as shown in FIG. 5, the low reflection layer 300 may be arranged over the entire surface of the display area DA (e.g., refer to FIG. 1), such that the low reflection layer 300 may be formed through continuous processes without a separate mask process.

Figure 6:
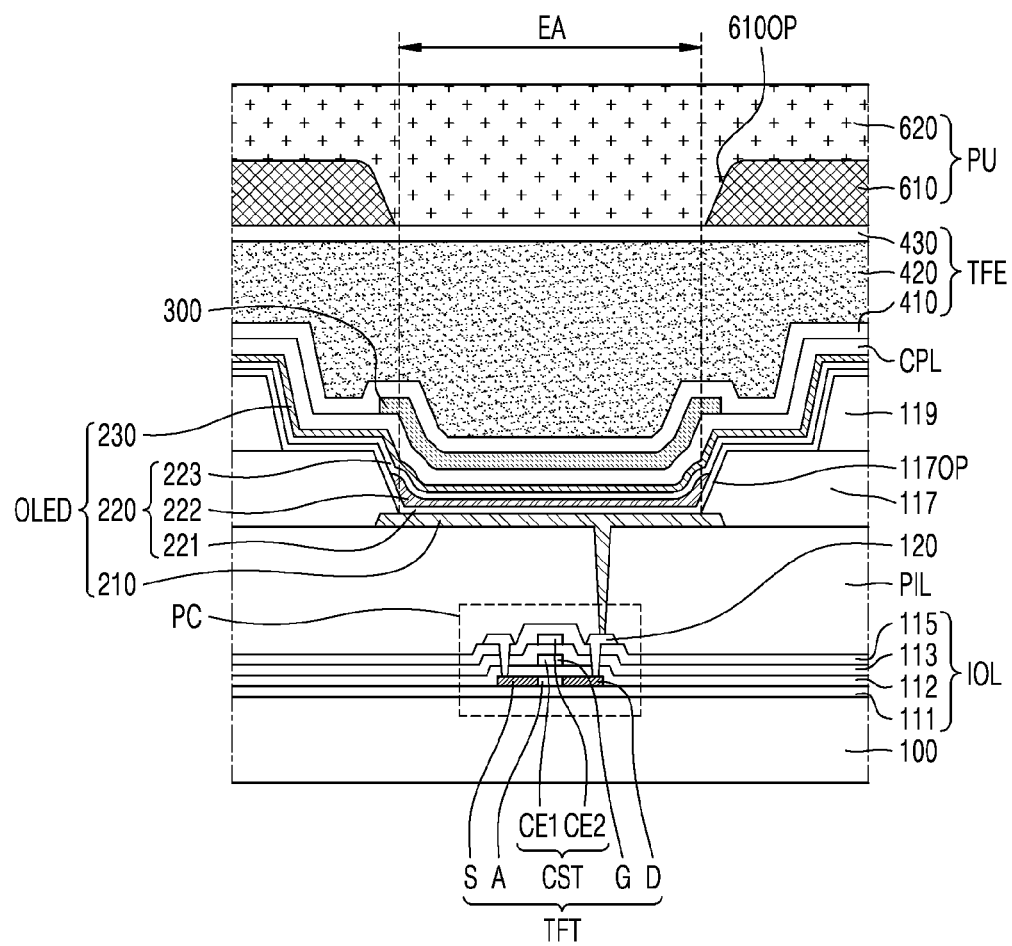

FIG. 6 is a schematic cross-sectional view of a display apparatus according to an embodiment.

In another embodiment, as shown in FIG. 6, the low reflection layer 300 may be arranged in correspondence with the emission area EA. Both ends of the low reflection layer 300 may overlap a partial region (or portion) of the pixel defining layer 117 in a plan view. For example, the low reflection layer 300 may overlap the emission area EA and an inclined surface (or side surface) of the low reflection layer 300 in a plan view. Thus, reflected light that is reflected from the inclined surface (or side surface) of the opening 117OP corresponding to the emission area EA may be reduced.

The low reflection layer 300 may include an inorganic material. The inorganic material of the low reflection layer 300 may include at least one of Yb, Bi, Co, Mo, Ti, Zr, Al, Cr, Nb, Pt, W, In, SnFe, Ni, Ta, Mn, Zn, and Ge. In an embodiment, a refractive index of the low reflection layer 300 may be about 1 or less. In an embodiment, an absorption rate of the low reflection layer 300 may be in a range of about 1.0 to about 4.0.

Light may be incident on an upper surface of the display panel DP (e.g., refer to FIG. 3A) and reflected from an upper surface of the low reflection layer 300 to form a first reflected light. Light may be incident on the upper surface of the display panel DP (e.g., refer to FIG. 3A) and reflected by structures arranged under the low reflection layer 300 to form a second reflected light. The first reflected light and the second reflected light may destructively interfere with each other. As described above, the low reflection layer 300 may reduce the external light reflectance of the display panel DP (e.g., refer to FIG. 3A) by the destructive interference. For example, the external light reflected from the metal structures arranged under the low reflection layer 300 may be invisible by the destructive interference. Thus, display quality and visibility of the display apparatus 1 may be improved.

An encapsulation layer ECL (e.g., refer to FIG. 3A) may cover (or overlap) a display layer including the pixel circuit PC, the insulating layers (e.g., planarization insulating layer PIL, inorganic insulating layers IOL, or the like), the display element OLED, and the low reflection layer 300.

In an embodiment, as shown in FIGS. 5 and 6, the encapsulation layer ECL (e.g., refer to FIG. 3A) may be the thin-film encapsulation layer TFE. The thin-film encapsulation layer TFE may include first and second inorganic encapsulation layers 410 and 430 and an organic encapsulation layer 420 arranged therebetween.

Each of the first and second inorganic encapsulation layers 410 and 430 may include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 410 and 430 may be formed through chemical vapor deposition.

The organic encapsulation layer 420 may include a pigment and a first organic material. The organic encapsulation layer 420 may absorb at least part of wavelength region (e.g., non-display wavelength region) of a visible light wavelength region, and reflective color coordinates of the display panel DP (e.g., refer to FIG. 3A) may be adjusted to have a target value. For example, the organic encapsulation layer 420 may adjust the reflective color coordinates of the display panel DP (e.g., refer to FIG. 3A), and the reflective color coordinates of the display panel DP (e.g., refer to FIG. 3A) may be within the target value.

In an embodiment, the pigment of the organic encapsulation layer 420 may include at least one of C.I Pigment Red 177, C.I Pigment Green 7, C.I Pigment Green 59, C.I Pigment Yellow 185, and C.I Pigment Blue 15:6. The pigment of the organic encapsulation layer 420 may be insoluble in the first organic material, and may be evenly dispersed and arranged in the first organic material. For example, the pigment and the first organic material may be uniformly mixed with each other in the organic encapsulation layer 420. As used herein, the expression "A is insoluble in B" means that the attraction between A particles (or materials) is greater than the attraction between an A particle (or material) and a B particle (or material), or the attraction between B particles (or materials). For example, the expression "A is evenly dispersed in B" means that A particles (or materials) with sizes in a range are mixed (or uniformly mixed) with a dispersion medium B without agglomeration.

In an embodiment, the organic encapsulation layer 420 may be formed by applying (or coating) a mixed material (or mixture) having flowability and including a monomer, and reacting the monomer (e.g., monomer in mixed material) to form a polymer by polymerization. For example, the mixture of the pigment and the monomer may be coated on a surface (e.g., upper surface of first organic encapsulation layer 410), and the monomer in the coated mixture may be reacted to form the polymer. Thus, the organic encapsulation layer 420 may be formed. The pigment may be evenly dispersed in the mixed material (or mixture) and the mixed material may be applied (or coated) on the surface. Accordingly, in case that the monomers form the organic encapsulation layer 420 through the polymerization, the pigment may be evenly dispersed and arranged in the first organic material. In another embodiment, the organic encapsulation layer 420 may be formed by applying (or coating) a polymer in which the pigment is dispersed.

The first organic material may include a base polymer having at least one of an acrylate group and an epoxy group. The organic encapsulation layer 420 may further include at least one of polyethylene terephthalate, polyethylene naphthalate, polycarbonate, polyimide, polyethylene sulfonate, polyoxymethylene, polyarylate, HMDSO, and an acryl-based resin (e.g., PMMA, polyacrylic acid, or the like).

The anti-reflection layer PU may be arranged on (or disposed on) the thin-film encapsulation layer TFE. The anti-reflection layer PU may include the light blocking layer 610 and the reflection adjusting layer 620.

In an embodiment, an opening pattern 6100P may be formed in the light blocking layer 610, and correspond to the emission area EA. In an embodiment, a width of the opening pattern 6100P may be the same as that of the opening 117OP of the pixel defining layer 117. However, embodiments of the disclosure are not limited thereto. In an embodiment, the width of the opening pattern 6100P may be greater than that of the emission area EA in a same direction. The opening pattern 6100P may be arranged in a light extraction direction (e.g., upper direction or z-axis direction 'z') of a pixel P (e.g., refer to FIG. 1) to reinforce straightness of light emitted from the emission area EA. Thus, light extraction efficiency of the display apparatus 1 (e.g., refer to FIG. 1) may be improved.

In an embodiment, the light blocking layer 610 may include a light blocking material, and may have a black color. The light blocking material of the light blocking layer 610 may include carbon black, carbon nanotubes, a resin or paste including a black dye, metal particles (e.g., Ni, Al, Mo, and alloy thereof), metal oxide particles (e.g., chromium oxide), or metal nitride particles (e.g., chromium nitride). In case that the light blocking layer 610 includes the light blocking material, metal structures arranged under (or disposed under) the light blocking layer 610 may reduce reflection of external light. In an embodiment, the light blocking layer 610 may be formed of a same material as that of the pixel defining layer 117 arranged thereunder. However, embodiments of the disclosure are not limited thereto.

The reflection adjusting layer 620 may be arranged on (or disposed on) the light blocking layer 610. For example, the reflection adjusting layer 620 may fill the opening pattern 6100P of the light blocking layer 610.

The reflection adjusting layer 620 may include a dye and a second organic material. The reflection adjusting layer 620 may absorb light belonging to at least part of the wavelength region (e.g., non-display wavelength region) that does not belong to the wavelength range (e.g., display wavelength region) of light emitted by the display element OLED. Accordingly, the reflection adjusting layer 620 may absorb a part of incident light that is incident into the display panel DP (e.g., refer to FIG. 3A) from the outside thereof, and/or a part of reflected light, which has been incident into the display panel from the outside thereof and is reflected by structures disposed under the reflection adjusting layer 620. Thus, the visibility of the display apparatus 1 (e.g., refer to FIG. 1) may be improved.

In an embodiment, the reflection adjusting layer 620 may absorb at least part of the visible light wavelength region (e.g., non-display wavelength region) that does not belong to the wavelength region (e.g., display wavelength region) of the light emitted by the display element OLED. For example, the wavelength region (e.g., display wavelength region) of the light emitted by the display element OLED may include a blue light wavelength region in a range of about 430 nm to about 480 nm, a green light wavelength region in a range of about 510 nm to about 575 nm, and a red light wavelength region in a range of about 605 nm to about 650 nm.

In an embodiment, the second organic material may include an acrylate-based polymer as a base polymer. However, embodiments of the disclosure are not limited thereto, and the second organic material may include any suitable polymer.

The dye may be soluble in the second organic material. As used herein, the expression "A is soluble in B" means that the attraction between A particles (or materials) equal to or less than the attraction between an A particle (or material) and a B particle (or material), or the attraction between B particles (or materials). For example, the expression "A is dissolved in B" means that A particles (or materials) are diffused into B particles (or materials) and are uniformly mixed.

In an embodiment, the reflection adjusting layer 620 may be formed by applying (or coating) a mixed material (e.g., dissolved mixture) having flowability and including a monomer, and reacting the monomer (e.g., monomer in dissolved mixture) to form a polymer by polymerization. For example, the dissolved mixture of the dye and the monomer may be coated on a surface (e.g., upper surface of light blocking layer 610), and the monomer in the coated dissolved mixture may be reacted to form the polymer. Thus, the reflection adjusting layer 620 may be formed. The dye may be evenly dissolved in the mixed material (e.g., dissolved mixture). Thus, in case that monomers form the reflection adjusting layer 620 through the polymerization, the monomers may be dissolved and arranged in the second organic material without agglomeration. In another embodiment, the reflection adjusting layer 620 may be formed by applying (or coating) a polymer in which the dye is dissolved.

In an embodiment, the pigment may be included (e.g., included only) in the organic encapsulation layer 420 among the organic encapsulation layer 420 and the reflection adjusting layer 620. For example, the reflection adjusting layer 620 may not include insoluble particles (e.g., pigments) that are not dissolved in the second organic material. Accordingly, the reflection adjusting layer 620 may have a lower refractive index compared to a reflection adjusting layer including both a pigment and a dye, and thus, interfacial reflection at an interface of the reflection adjusting layer 620 may be reduced.

Figure 7:
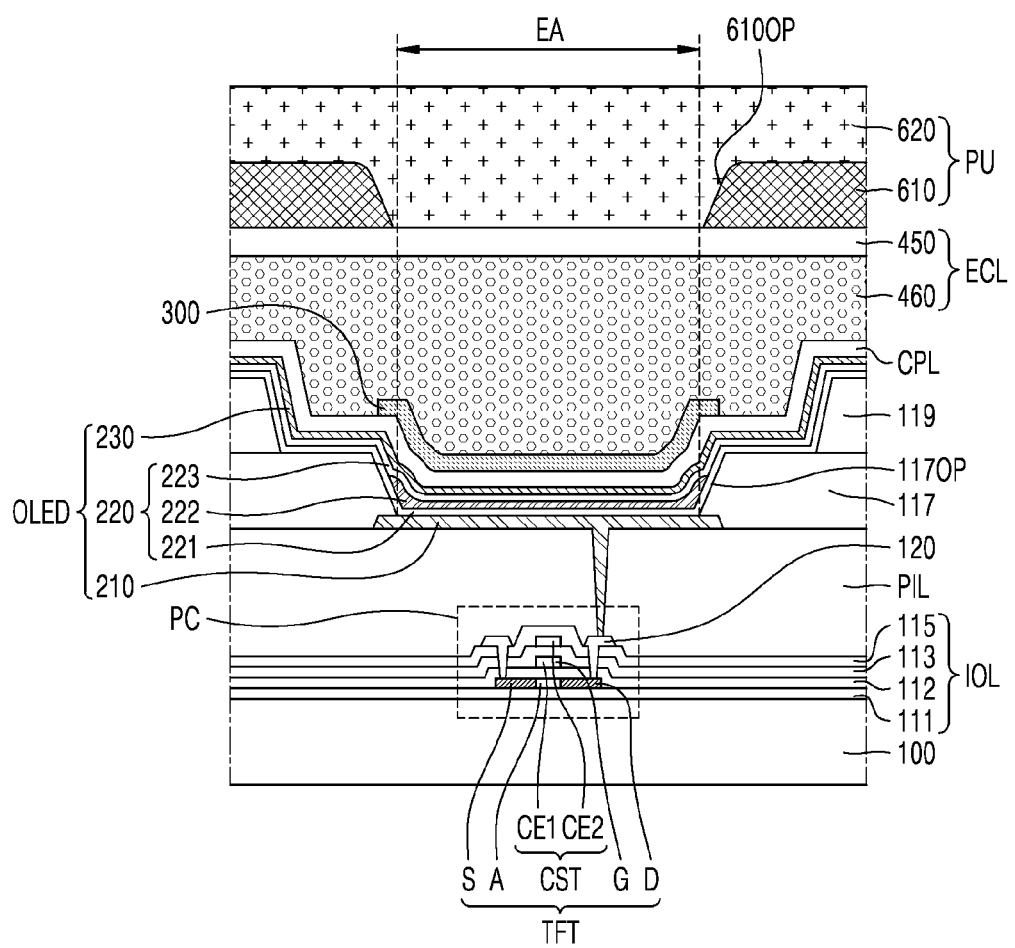
FIG. 7 is a schematic cross-sectional view of a display apparatus according to an embodiment.

FIG. 7 is a schematic cross-sectional view of a display apparatus according to an embodiment.

FIG. 7 is similar to FIGS. 5 and 6, but the display apparatus of FIG. 7 is different from the display apparatus of FIGS. 5 and 6 in that an encapsulation layer ECL includes an encapsulation substrate 450 and a filing material 460. The other components are the same as those of the embodiments of FIGS. 5 and 6, and thus, differences between FIG. 7 and FIGS. 5 and 6 will be mainly described below.

Referring to FIG. 7, the encapsulation layer ECL may include the encapsulation substrate 450 and the filling material 460, and provide a flat surface. The encapsulation substrate 450 may include glass. In case that the encapsulation substrate 450 includes the glass, a substrate 100 may also include glass.

Although not shown in FIG. 7, a sealant (not shown) may be arranged between the encapsulation substrate 450 and the substrate 100. The sealant may be arranged in a peripheral area NDA (e.g., refer to FIG. 1), and may surround a display area DA (e.g., refer to FIG. 1). The sealant may be provided along a periphery of the display area DA (e.g., refer to FIG. 1), and prevent or minimize penetration of moisture or the like into the display area DA (e.g., refer to FIG. 1) through a side surface of the display apparatus 1 (refer to FIG. 1).

The filling material 460 may be arranged between a low reflection layer 300 and the encapsulation substrate 450. The filling material 460 may include a pigment and a first organic material. The filling material 460 may absorb at least part of wavelength region (e.g., non-display wavelength region) of a visible light wavelength region, and reflective color coordinates of a display panel DP (e.g., refer to FIG. 3A) may be adjusted to have a target value. For example, the filling material 460 may adjust the reflective color coordinates of the display panel DP (e.g., refer to FIG. 3A), and the reflective color coordinates of the display panel DP (e.g., refer to FIG. 3A) may be within the target value.

In an embodiment, the pigment of the filling material 460 may include at least one of C.I Pigment Red 177, C.I Pigment Green 7, C.I Pigment Green 59, C.I Pigment Yellow 185, and C.I Pigment Blue 15:6. The pigment of the filling material 460 may be insoluble in the first organic material, and may be evenly dispersed and arranged in the first organic material. For example, the pigment and the first organic material may be uniformly mixed with each other in the filling material 460.

In an embodiment, the filling material 460 may be formed by applying (or coating) a mixed material (or mixture) having flowability and including a monomer, and reacting the monomer (e.g., monomer in the mixed material) to form a polymer by polymerization. For example, the mixture of the pigment and the monomer may be coated on a surface (e.g., upper surfaces of capping layer CPL and low reflection layer 300), and the monomer in the coated mixture may be reacted to form the polymer. Thus, the filling material 460 may be formed. The pigment may be evenly dispersed in the mixed material (or mixture) and the mixed material may be applied (or coated) on the surface. Accordingly, in case that monomers form the filling material 460 through the polymerization, the pigment may be evenly dispersed and arranged in the first organic material. In another embodiment, the filling material 460 may be formed by applying (or coating) a polymer in which the pigment is dispersed.

The first organic material may include a base polymer having at least one of an acrylate group and an epoxy group. The filling material 460 may further include at least one of polyethylene terephthalate, polyethylene naphthalate, PC, polyimide, polyethylene sulfonate, polyoxymethylene, polyarylate, HMDSO, and an acryl-based resin (e.g., PMMA, polyacrylic acid, or the like).

Figure 8:
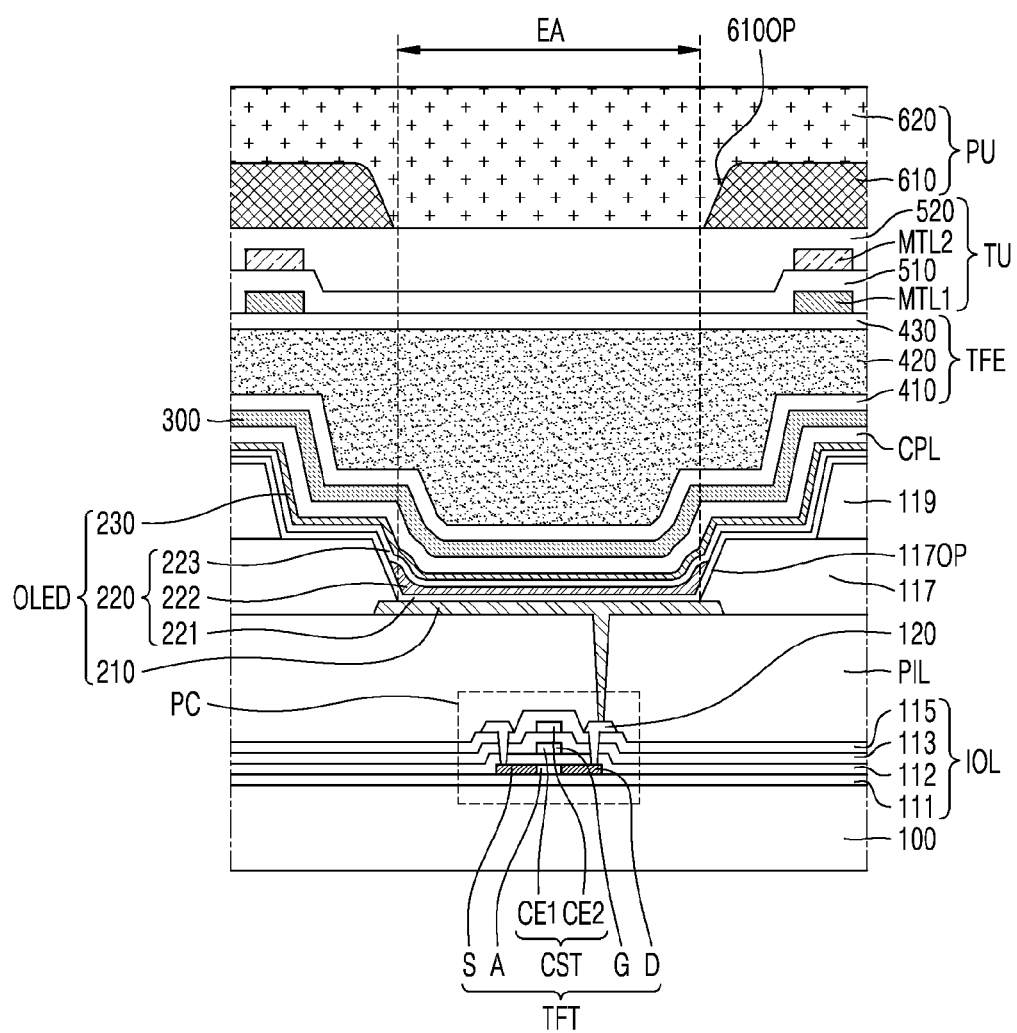
FIGS. 8 and 9 are schematic cross-sectional views of a display apparatus according to embodiments.
Figure 9:
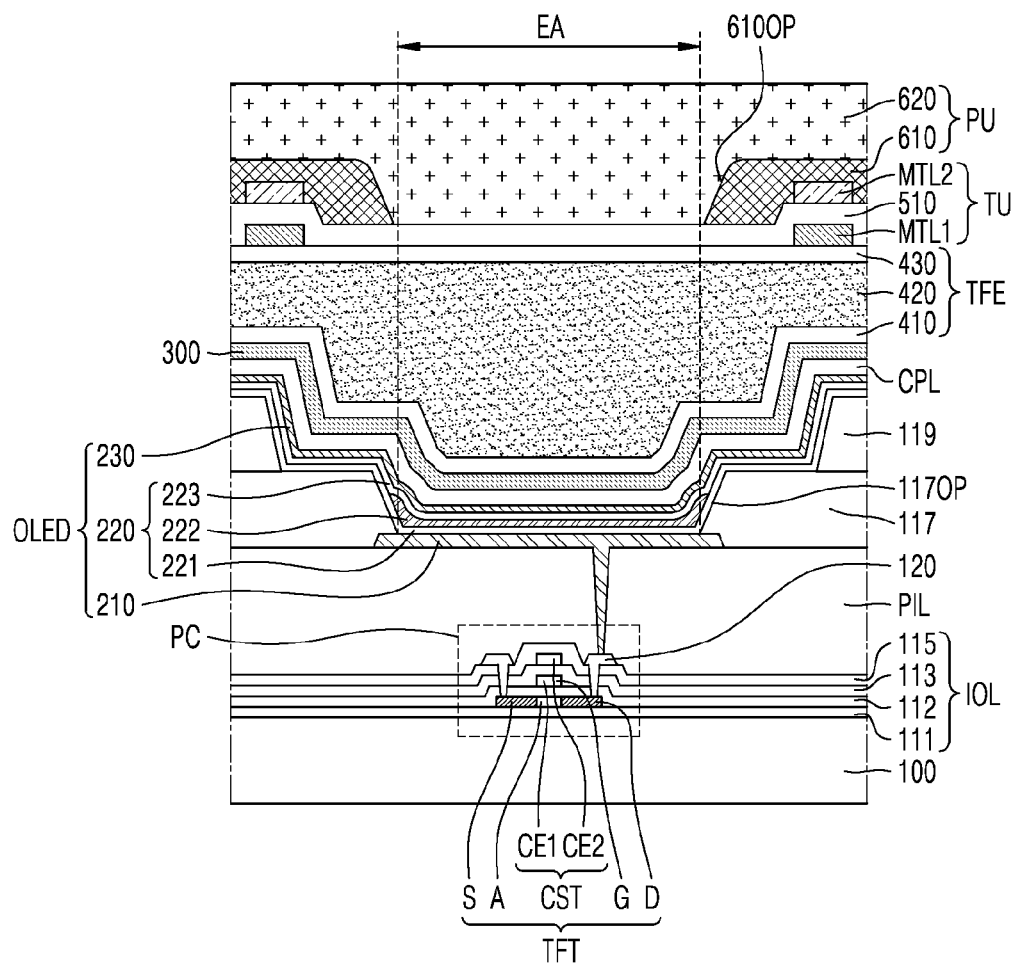

FIGS. 8 and 9 are schematic cross-sectional views of display apparatuses according to embodiments.

FIGS. 8 and 9 are similar to FIG. 5, but the display apparatus of FIGS. 8 and 9 is different from the display apparatus of FIG. 5 in that an input sensing layer TU may be arranged on (or disposed on) a thin-film encapsulation layer TFE. The other components are the same as those of the embodiment of FIG. 5, and thus, differences between FIGS. 8 and 9 and FIG. 5 will be mainly described below.

Referring to FIG. 8, the low reflection layer 300 may be arranged on (or disposed on) a display element OLED. As shown in FIG. 8, a capping layer CPL may be arranged between a low reflection layer 300 and the display element OLED.

In an embodiment, as shown in FIG. 8, the low reflection layer 300 may overlap the display area DA (e.g., refer to FIG. 1) in a plan view. In another embodiment, as shown in FIG. 6, the low reflection layer 300 may be arranged in correspondence with an emission area EA.

In an embodiment, the input sensing layer TU may be arranged (e.g., directly arranged) on the thin-film encapsulation layer TFE. In another embodiment, an insulating layer (not illustrated) may be further included between the thin-film encapsulation layer TFE and a first conductive layer MTL1. For example, the insulating layer (not illustrated) may include an inorganic insulating material such as silicon oxide ($SiO_2$), silicon nitride (SiNx), silicon oxynitride (SiON), or the like. In another example, the insulating layer (not illustrated) may include an organic insulating material. As described above, the thin-film encapsulation layer TFE may include an organic encapsulation layer 420 including a pigment, and provide a flat base surface. Accordingly, even in case that the components of the input sensing layer TU are formed by continuous processes, the defective rate may be reduced.

The input sensing layer TU may have a multi-layer structure (or multiple layers). The input sensing layer TU may include a sensing electrode, a signal line (or trace line) connected (e.g., electrically connected) to the sensing electrode, and at least one insulating layer. The input sensing layer TU may sense an external input according to, for example, an electrostatic capacitive method. An operating method of the input sensing layer TU is not limited thereto. In an embodiment, the input sensing layer TU may sense an external input according to an electromagnetic induction method or a pressure sensing method.

The input sensing layer TU may include the first conductive layer MTL1, a first insulating layer 510, and a second conductive layer MTL2.

For example, each of the first conductive layer MTL1 and the second conductive layer MTL2 may have a single-layer structure or a stacked multi-layer structure (or multiple layers). The conductive layer (e.g., first conductive layer MTL1 and/or second conductive layer MTL2) having the single-layer structure may include a metal layer or a transparent conductive layer. The metal layer of the conductive layer (e.g., first conductive layer MTL1 and/or second conductive layer MTL2) may include at least one of molybdenum, silver, titanium, copper, aluminum, and an alloy thereof. The transparent conductive layer of the conductive layer (e.g., first conductive layer MTL1 and/or second conductive layer MTL2) may include a transparent conductive oxide such as ITO, IZO, ZnO, indium tin zinc oxide (ITZO), or the like. For example, the transparent conductive layer may include a conductive polymer such as PEDOT, metal nanowires, graphene, or the like.

The conductive layer (e.g., first conductive layer MTL1 and/or second conductive layer MTL2) having the multi-layer structure (or multiple layers) may include metal layers. The metal layers may have, for example, a three-layer structure of Ti/Al/Ti. The conductive layer (e.g., first conductive layer MTL1 and/or second conductive layer MTL2) having the multi-layer structure (or multiple layers) may include at least one metal layer and at least one transparent conductive layer.

Each of the first conductive layer MTL1 and the second conductive layer MTL2 may include patterns. For example, the first conductive layer MTL1 may include first conductive patterns, and that the second conductive layer MTL2 may include second conductive patterns. The first conductive patterns and the second conductive patterns may form a sensing electrode.

The first conductive layer MTL1 and the second conductive layer MTL2 may be connected (e.g., electrically connected) to each other through a contact hole. In an embodiment, the first conductive layer MTL1 and the second conductive layer MTL2 may have a mesh structure, and pass light emitted by the display element OLED. For example, the first conductive layer MTL1 and the second conductive layer MTL2 may not overlap the emission area EA in a plan view.

The first insulating layer 510 may have a single-layer or multi-layer structure (or multiple layers). The first insulating layer 510 may include an inorganic material or a composite material (e.g., combination of at least two materials or mixture thereof). For example, the first insulating layer 510 may include an inorganic layer. The inorganic layer may include at least one of aluminum oxide, titanium oxide, silicon oxide, silicon oxynitride, silicon nitride, zirconium oxide, and hafnium oxide. In another embodiment, the first insulating layer 510 may be replaced by an organic insulating layer.

In FIG. 8, an encapsulation layer ECL (e.g., refer to FIG. 7) may be composed of or implemented with the thin-film encapsulation layer TFE. For example, the encapsulation layer ECL of FIG. 7 may be replaced by the thin-film encapsulation layer TFE. However, in another embodiment, the encapsulation layer ECL (e.g., refer to FIG. 7) may include an encapsulation substrate 450 (e.g., refer to FIG. 7) and a filling material 460 (e.g., refer to FIG. 7). In case that the encapsulation layer ECL (e.g., refer to FIG. 7) includes the encapsulation substrate 450 (e.g., refer to FIG. 7) and the filling material 460 (e.g., refer to FIG. 7), the input sensing layer TU may be formed (e.g., directly formed) on the encapsulation substrate 450 (e.g., refer to FIG. 7). In another example, the input sensing layer TU may be separately formed and adhered to the encapsulation substrate 450 by using an optically clear adhesive member OCA (refer to FIG. 2) or an adhesive layer.

In an embodiment, as shown in FIG. 8, the input sensing layer TU may further include a second insulating layer 520. The second insulating layer 520 may include an inorganic material or an organic material. The inorganic material of the second insulating layer 520 may include at least one material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material of the second insulating layer 520 may include at least one material selected from the group consisting of an acryl-based resin, a methacryl-based resin, polyisoprene, a vinyl-based resin, an epoxy-based resin, a urethane-based resin, a cellulose-based resin, and a perylene-based resin.

In another embodiment, as shown in FIG. 9, an anti-reflection layer PU may be arranged (e.g., directly arranged) on a second conductive layer MTL2 of an input sensing layer TU. For example, a light blocking layer 610 may be arranged on (or disposed on) the second conductive layer MTL2, and a second insulating layer 520 may be omitted.

Referring to FIGS. 8 and 9, a light blocking layer 610 may have an opening pattern 6100P corresponding to the emission area EA. In an embodiment, the light blocking layer 610 may overlap the first conductive layer MTL1 and the second conductive layer MTL2 in a plan view. Accordingly, the light blocking layer 610 may reduce reflection of external light due to the first conductive layer MTL1 and the second conductive layer MTL2, and reflectance characteristics of the display apparatus 1 (e.g., refer to FIG. 1) may be improved. For example, reflectance of the display apparatus 1 (e.g., refer to FIG. 1) may be reduced, and image display quality of the display apparatus 1 (e.g., refer to FIG. 1) may be improved.

A reflection adjusting layer 620 may be arranged on (or disposed on) the light blocking layer 610, and may fill the opening pattern 6100P. The reflection adjusting layer 620 may include a dye and a second organic material to absorb a part of incident light that is incident thereinto from the outside, and/or a part of reflected light that is reflected by structures disposed under the reflection adjusting layer 620. Accordingly, the display apparatus 1 (e.g., refer to FIG. 1) may include the low reflection layer 300 and the reflection adjusting layer 620, and reflectance of external light may be reduced without arranging a retarder (not illustrated) and/or a polarizer (not illustrated) on the input sensing layer TU.

For example, the organic encapsulation layer 420 arranged under the input sensing layer TU may include a pigment and a first organic material. Accordingly, the organic encapsulation layer 420 may reduce white angular dependency, which may occur at an edge due to a curvature of the display panel DP (e.g., refer to FIG. 3A), and may adjust a reflective color. In case that a reflection adjusting layer includes both a dye and a pigment, a refractive index of a display panel may not be reduced. However, in case that the organic encapsulation layer 420 (e.g., only organic encapsulation layer 420) among the organic encapsulation layer 420 and the reflection adjusting layer 620 includes the pigment, a refractive index of the reflection adjusting layer 620 without the pigment may be reduced. Thus, reflectance of the display panel DP (e.g., refer to FIG. 3A) may be improved. For example, the refractive index of the display panel including the reflection adjusting layer including both the dye and the pigment may be greater than that of the display panel DP (e.g., refer to FIG. 3A) including the reflection adjusting layer 620 without the pigment.

Figure 10:
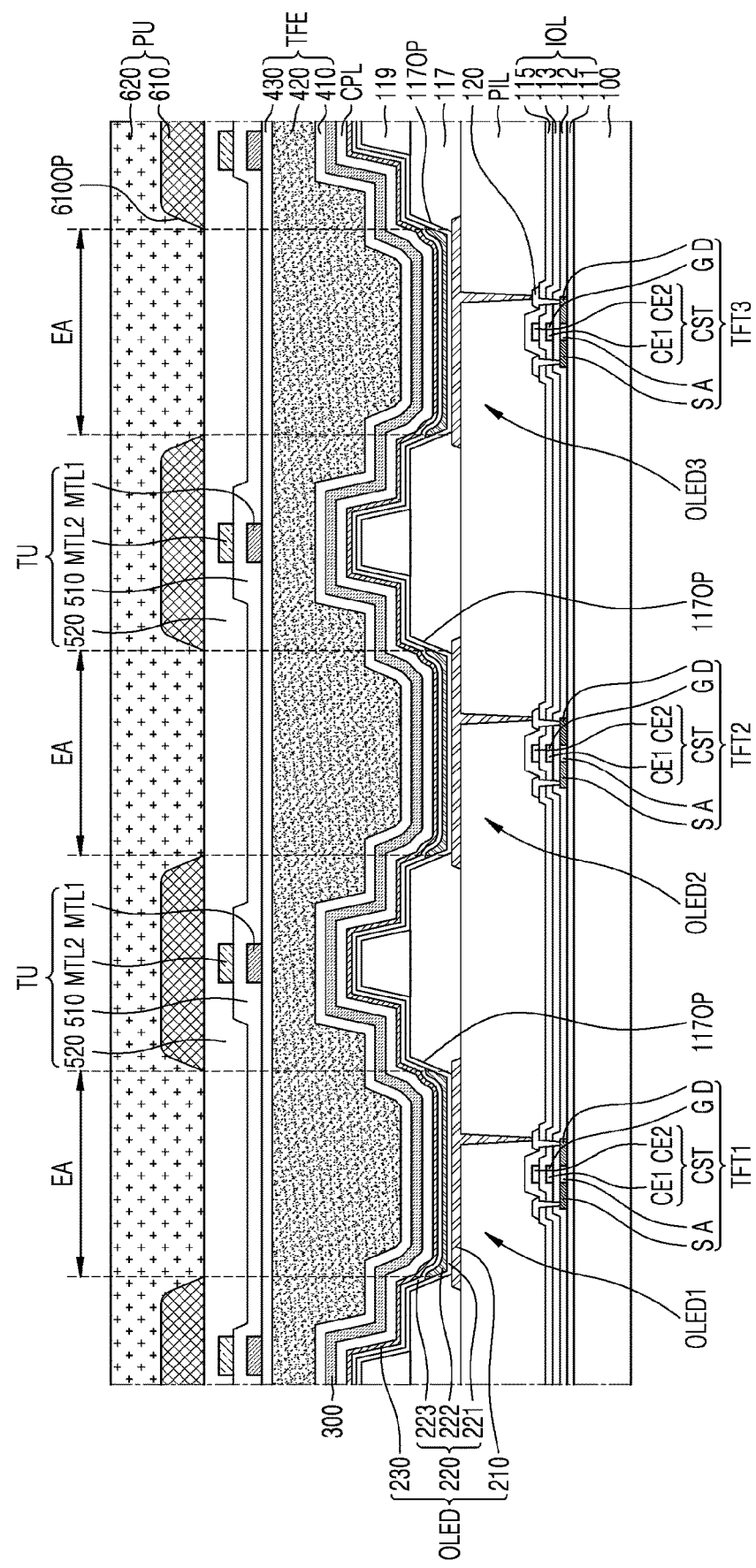
FIGS. 10 and 11 are schematic cross-sectional views of a display apparatus according to embodiments.
Figure 11:
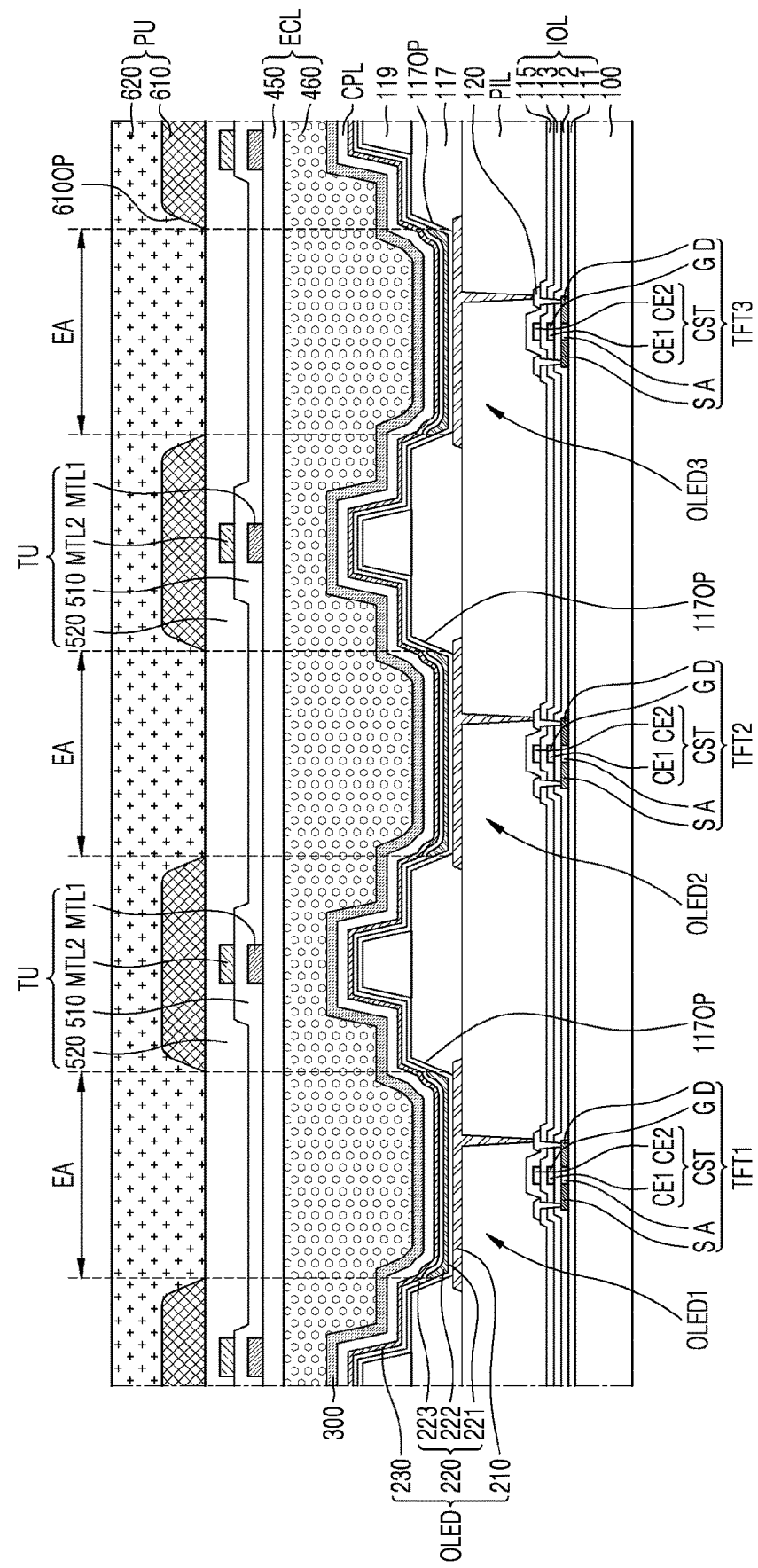

FIG. 10 is a schematic cross-sectional view of the display apparatus 1 according to an embodiment. FIG. 11 is a schematic cross-sectional view of a display apparatus according to an embodiment.

Referring to FIG. 10, in the display apparatus 1 according to an embodiment, a first display element OLED1, a second display element OLED2, and a third display element OLED3 may be arranged on (or disposed on) the substrate 100. For example, the first display element OLED1, the second display element OLED2, and the third display element OLED3 may emit light of different colors.

In an embodiment, as shown in FIG. 10, a low reflection layer 300 may be integrally provided over the entire surface of a display area DA (e.g., refer to FIG. 2). Accordingly, the low reflection layer 300 may be integrally arranged over the first display element OLED1, the second display element OLED2, and the third display element OLED3. In another embodiment, the low reflection layer 300 may be patterned and correspond to an emission area EA of each of the first display element OLED1, the second display element OLED2, and the third display element OLED3. For example, the low reflection layer 300 may include patterns corresponding to emission areas EA of the first display element OLED1, the second display element OLED2, and the third display element OLED3, respectively.

An encapsulation layer ECL (e.g., refer to FIG. 3A) may be arranged on (or disposed on) the low reflection layer 300. In an embodiment, as shown in FIG. 10, the encapsulation layer ECL (e.g., refer to FIG. 3A) may be provided as or implemented with a thin-film encapsulation layer TFE. The thin-film encapsulation layer TFE may include at least one inorganic encapsulation layer including first and second inorganic encapsulation layers 410 and 430 and at least one organic encapsulation layer 420. For example, the organic encapsulation layer 420 may include a pigment and a first organic material.

In another embodiment, as shown in FIG. 11, the encapsulation layer ECL may include an encapsulation substrate 450 and a filling material 460. For example, the filling material 460 may include a pigment and a first organic material.

Referring to FIGS. 10 and 11, the organic encapsulation layer 420 or the filling material 460 may absorb at least part of a wavelength region (e.g., non-display wavelength region) of incident light that is incident thereinto from the outside and at least part of a wavelength region (e.g., non-display wavelength region) of reflected light. Thus, the organic encapsulation layer 420 and/or the filling material 460 may adjust reflective color coordinates of the display panel DP (e.g., refer to FIG. 3A) to have a target value. For example, the organic encapsulation layer 420 and/or the filling material 460 may adjust the reflective color coordinates of the display panel DP (e.g., refer to FIG. 3A), and the reflective color coordinates of the display panel DP (e.g., refer to FIG. 3A) may be within the target value.

The encapsulation layer ECL may be integrally provided over the entire surface of the display area DA (e.g., refer to FIG. 2). Accordingly, the organic encapsulation layer 420 or the filling material 460, which includes the pigment, may be integrally arranged over the first display element OLED1, the second display element OLED2, and the third display element OLED3.

In an embodiment, an input sensing layer TU may be arranged (e.g., directly arranged) on the encapsulation layer ECL (e.g., refer to FIG. 3A). In case that the encapsulation layer ECL includes the encapsulation substrate 450 and the filling material 460, the input sensing layer TU may be formed (e.g., directly formed) on the encapsulation substrate 450. In another example, the encapsulation layer ECL may be separately formed and adhered to the encapsulation substrate 450 by using an optically clear adhesive member OCA (e.g., refer to FIG. 2) or the like.

An anti-reflection layer PU may be arranged on (or disposed on) the input sensing layer TU. The anti-reflection layer PU may include a light blocking layer 610 and a reflection adjusting layer 620. The light blocking layer 610 may include an opening pattern 6100P corresponding to the emission area EA of each of the first display element OLED1, the second display element OLED2, and the third display element OLED3. The reflection adjusting layer 620 may fill inside of the opening pattern 6100P, and may be integrally arranged over the entire surface of the display area DA (e.g., refer to FIG. 2). The reflection adjusting layer 620 may include a dye and a second organic material, and absorb a part of the incident light that is incident thereinto from the outside, and/or a part of the reflected light that is reflected by structures disposed under the reflection adjusting layer 620. Thus, the reflection adjusting layer 620 may improve the reflectance characteristics of the display panel DP (e.g., refer to FIG. 3A).

Figure 12:
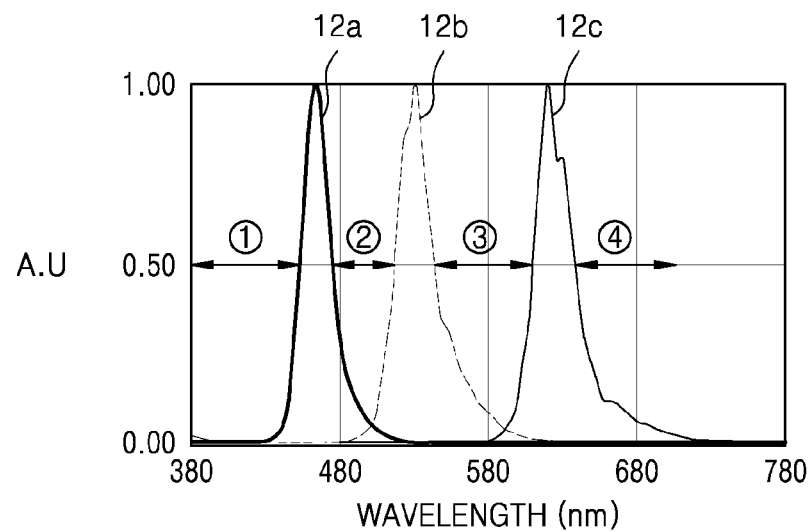
FIG. 12 is a graph schematically describing a wavelength region absorbed by a reflection adjusting layer of a display apparatus according to an embodiment.

FIG. 12 is a graph schematically describing a wavelength region absorbed by the reflection adjusting layer 620 (e.g., refer to FIG. 3A) of the display apparatus 1 (e.g., refer to FIG. 1) according to an embodiment.

Referring to FIG. 12, the display element OLED (e.g., refer to FIG. 3A) of the display apparatus 1 (e.g., refer to FIG. 1) according to an embodiment may emit red light 12c, green light 12b, blue light 12a, or white light. For example, the blue light 12a may have a maximum wavelength of about 460 nm, the green light 12b may have a maximum wavelength in a range of about 530 nm to about 540 nm, and the red light 12c may have a maximum wavelength of about 630 nm.

The reflection adjusting layer 620 (e.g., refer to FIG. 3A) may absorb light belonging to at least part of a wavelength region (e.g., non-display wavelength region) that does not belong to the wavelength range (e.g., display wavelength region) of the light emitted by the display element OLED (e.g., refer to FIG. 3A). In an embodiment, the reflection adjusting layer 620 (e.g., refer to FIG. 3A) may absorb light in at least two wavelength regions among a first wavelength region in a range of about 350 nm to about 430 nm, a second wavelength region in a range of about 480 nm to about 510 nm, a third wavelength region in a range of about 575 nm to about 605 nm, and a fourth wavelength region in a range of about 650 nm to about 700 nm. For example, the first to fourth wavelength regions may be included in the wavelength region (e.g., non-display wavelength region). For example, an absorption peak wavelength of the reflection adjusting layer 620 (e.g., refer to FIG. 3A) may be arranged in at least two wavelength regions among the first wavelength region, the second wavelength region, the third wavelength region, and the fourth wavelength region. In an embodiment, the reflection adjusting layer 620 (e.g., refer to FIG. 3A) may absorb light in the second wavelength region and the third wavelength region.

In case that the reflection adjusting layer 620 (e.g., refer to FIG. 3A) absorbs light in a blue light wavelength region (about 430 nm to about 480 nm), light in a green light wavelength region (about 510 nm to about 575 nm), or light in a red light wavelength region (about 605 nm to about 650 nm) of the display element OLED (e.g., refer to FIG. 3A), the emission efficiency of the display apparatus 1 (e.g., refer to FIG. 1) may be reduced. Accordingly, in case that the reflection adjusting layer 620 (e.g., refer to FIG. 3A) absorbs the light belonging to at least two wavelength regions among the first wavelength region, the second wavelength region, the third wavelength region, and the fourth wavelength region, the reflection adjusting layer 620 (e.g., refer to FIG. 3A) may prevent or minimize a decrease in the emission efficiency of the display apparatus 1 (e.g., refer to FIG. 1), and improve the external light reflectance characteristics thereof to thereby improve the visibility (or image display quality) thereof.

In an embodiment, the reflection adjusting layer 620 (e.g., refer to FIG. 3A) may include at least two dyes among a first dye absorbing the light in the first wavelength region, a second dye absorbing the light in the second wavelength region, a third dye absorbing the light in the third wavelength region, and a fourth dye absorbing the light in the fourth wavelength region. In an embodiment, the reflection adjusting layer 620 (e.g., refer to FIG. 3A) may include the second dye absorbing the light in the second wavelength region and the third dye absorbing the light in the third wavelength region.

In an embodiment, the first dye may include at least one of a metal porphyrin compound, a methine compound, and a triazine compound. The second dye may be a pyrromethene compound. The third dye may be a tetra-azaporphyrin compound. The fourth dye may be a phthalocyanine compound. However, embodiments of the disclosure are not limited thereto.

In an embodiment, an amount of each dye included in the reflection adjusting layer 620 (e.g., refer to FIG. 3A) may be in a range of about 0.005 wt % to about 0.5 wt %. In case that the amount of each dye included in the reflection adjusting layer 620 (e.g., refer to FIG. 3A) is 0.005 wt % or less, a light absorption rate of the wavelength region (e.g., non-display wavelength region) corresponding to the dye may be low. However, in case that the amount of each dye included in the reflection adjusting layer 620 (e.g., refer to FIG. 3A) is greater than 0.5 wt %, the dye may not be sufficiently dissolved in the second organic material.

Hereinafter, a display apparatus according to an embodiment is provided below with reference to an experimental example.

Experimental Example

As Example Apparatus 1 (e.g., refer to FIG. 1), a display panel of a display apparatus according to an embodiment is prepared. As Comparative Apparatus for comparison with Example Apparatus 1 (e.g., refer to FIG. 1), a display panel of a display apparatus in which a reflection adjusting layer includes both a dye and a pigment is prepared.

In Example Apparatus 1 (e.g., refer to FIG. 1), a reflection adjusting layer 620 (e.g., refer to FIG. 3A) includes a first dye absorbing light in a first wavelength region and a third dye absorbing light in a third wavelength region, and an organic encapsulation layer 420 (e.g., refer to FIG. 3A) includes a pigment adjusting a reflective color. For example, Example Apparatus 1 (e.g., refer to FIG. 1) includes FDB-002 (product name, manufactured by Yamada Kagaku Kogyo Co., Ltd., Japan) as the first dye and NEC-594 (product name, manufactured by Ukseung Chemical Co., Ltd., South Korea) as the third dye, each in an amount of 0.005 wt % to 0.5 wt %. The organic encapsulation layer 420 (e.g., refer to FIG. 5) includes C.I Pigment Yellow 185 as a pigment.

In Comparative Apparatus 1, a reflection adjusting layer includes a first dye, a third dye, and a pigment, and an organic encapsulation layer does not include a dye or a pigment. Comparative Apparatus 1 includes FDB-002 (product name, manufactured by Yamada Kagaku Kogyo Co., Ltd., Japan) as the first dye and NEC-594 (product name, manufactured by Ukseung Chemical Co., Ltd., South Korea) as the third dye, each in an amount of 0.005 wt % to 0.5 wt %, and includes C.I Pigment Yellow 185 as the pigment.

In Comparative Apparatus 2, a reflection adjusting layer includes a first dye and a third dye, and an organic encapsulation layer does not include a dye and a pigment. Comparative Apparatus 2 is similar to Comparative Apparatus 1, but is different from Comparative Apparatus 1 in that the reflection adjusting layer and the organic encapsulation layer do not include a pigment.

The low reflection layer 300 (e.g., refer to FIG. 5) of each of Example Apparatus 1, Comparative Apparatus 1, and Comparative Apparatus 2 includes bismuth (Bi).

Figure 13:
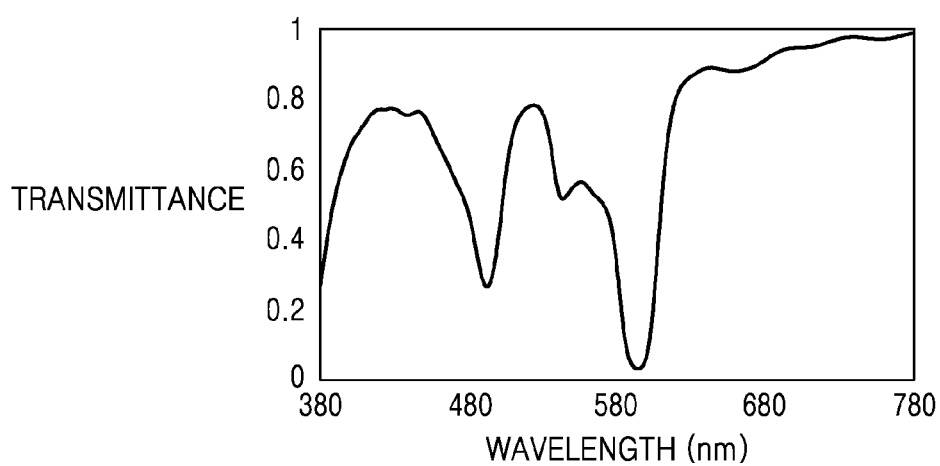
FIG. 13 is a graph schematically showing a spectrum evaluation result of a reflection adjusting layer of Comparative Apparatus 1.
Figure 14A:
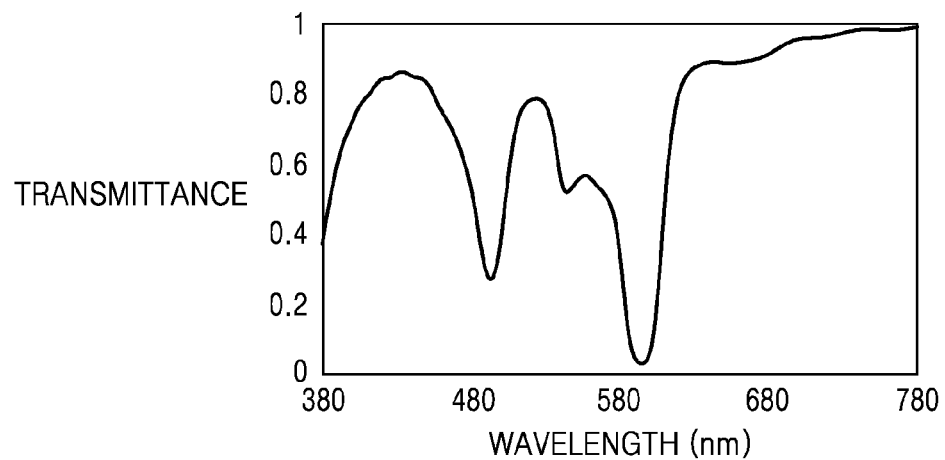
FIGS. 14A and 14B are graphs schematically showing spectrum evaluation results of a reflection adjusting layer and an organic encapsulation layer of Example Apparatus 1, respectively.
Figure 14B:
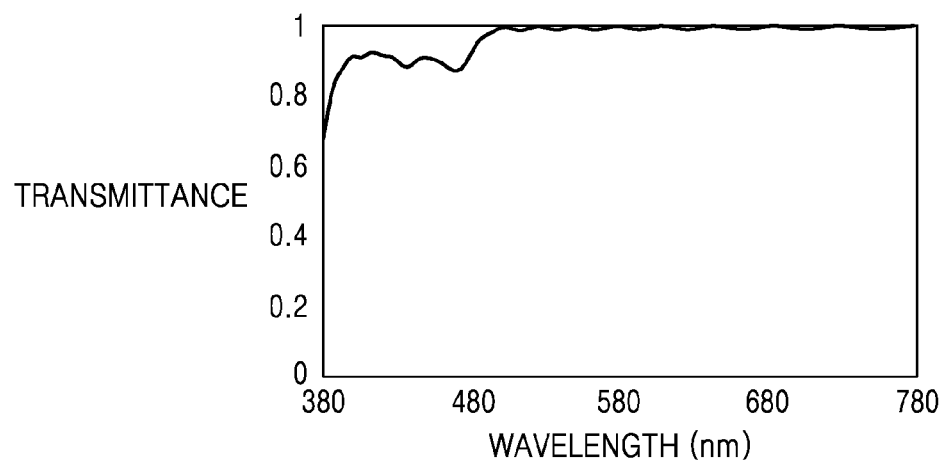

FIG. 13 is a graph schematically showing a spectrum evaluation result of Comparative Apparatus 1, and FIGS. 14A and 14B are graphs schematically showing spectrum evaluation results of the reflection adjusting layer 520 (e.g., refer to FIG. 8) and the organic encapsulation layer 420 (e.g., refer to FIG. 5) of Example Apparatus 1, respectively.

Referring to FIG. 13, the reflection adjusting layer 620 (e.g., refer to FIG. 5) including the first dye, the third dye, and the pigment absorbs light in a first wavelength region of 350 nm to 430 nm and light in a third wavelength region of 575 nm to 605 nm.

Referring to FIG. 14A, the reflection adjusting layer 620 (e.g., refer to FIG. 5) of Example Apparatus 1 absorbs light in the first wavelength region and light in the third wavelength region. However, the reflection adjusting layer 620 (e.g., refer to FIG. 5) of Example Apparatus 1 does not include a pigment, and thus has a slightly higher light transmittance than the reflection adjusting layer of Comparative Apparatus 1 in a wavelength region of 380 nm to 480 nm.

Referring to FIG. 14B, the organic encapsulation layer 420 (e.g., refer to FIG. 5) of Example Apparatus 1 includes a pigment, and thus absorbs light in the wavelength region of 380 nm to 480 nm.

Table 1 below shows the respective refractive indices of the reflection adjusting layer 620 (e.g., refer to FIG. 5), the optically clear adhesive member OCA (e.g., refer to FIG. 2), and the window layer WU (e.g., refer to FIG. 2), and the total interfacial reflectance of each of Example Apparatus 1 and Comparative Apparatus 1.

TABLE 1

|  | Example Apparatus 1 | Comparative Apparatus 1 |
|---|---|---|
| Window layer | 1.5 | 1.5 |
| Optically clear adhesive member | 1.48 | 1.48 |
| Reflection adjusting layer | 1.576 | 1.595 |
| Total interfacial reflectance | 0.10% | 0.14% |

Referring to Table 1, in case that the refractive index of an organic layer constituting the reflection adjusting layer 620 (e.g., refer to FIG. 5) without a pigment or a dye is 1.53, the refractive index of the reflection adjusting layer 620 (e.g., refer to FIG. 5) of Example Apparatus 1 including only a dye is 1.576, and the refractive index of the reflection adjusting layer of Comparative Apparatus 1 (e.g., refer to FIG. 1) including both a dye and a pigment is 1.595.

The interfacial reflectance may be calculated according to Equation 1 below.

$$R = \left(\frac{n_2 - n_1}{n_2 + n_1}\right)^2 \quad \text{Equation 1}$$

Accordingly, the total interfacial reflectance (0.10%) of Example Apparatus 1, of which refractive index has a small difference from the refractive index (1.48) of an adjacent optically clear adhesive member, is less than the total interfacial reflectance (0.14%) of Comparative Apparatus 1.

Table 2 below shows the specular reflectance (SCI), reflective color coordinates, and light efficiency of each of Example Apparatus 1, Comparative Apparatus 1, and Comparative Apparatus 2.

TABLE 2

| Panel | Example Apparatus 1 | Comparative Apparatus 1 | Comparative Apparatus 2 |
|---|---|---|---|
| SCI (panel measurement) | 5.07% | 5.12% | 5.11% |
| Reflective color coordinates x | 0.311 | 0.311 | 0.307 |
| y | 0.323 | 0.323 | 0.316 |
| Efficiency | 115% | 115% | 118% |

Referring to Table 2, Comparative Apparatus 2, in which the reflection adjusting layer includes only a dye, and the organic encapsulation layer is transparent, has a specular reflectance of 5.11% and reflective color coordinates (x, y) of (0.307, 0.316), and thus has a higher specular reflectance than Example Apparatus 1. The reflective color coordinates of Comparative Apparatus 2 were out of standard reflective color coordinates.

The refractive index of the reflection adjusting layer of Example Apparatus 1 is 1.576. In case that the optically clear adhesive member OCA (refer to FIG. 2) and the window layer WU having respective refractive indices of 1.5 and 1.48 are arranged on (or disposed on) the reflection adjusting layer, the total interfacial reflectance thereof is 0.10%. Although the specular reflectance of Example Apparatus 1 is 5.07%, which is lower than that of Comparative Apparatus 1, the reflective color coordinates (x, y) thereof are (0.311, 0.323), and thus, Example Apparatus 1 maintains similar optical characteristics as those of Comparative Apparatus 1. Accordingly, due to the decrease in the interfacial reflectance of the reflection adjusting layer, Example Apparatus 1 satisfies a reflective color profile and panel reflectance thereof is reduced.

According to the embodiment as described above, a display apparatus having improved reflectance characteristics may be implemented. For example, the reflectance of the display apparatus may be reduced. However, the scope of the disclosure is not limited thereto.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display apparatus comprising:
    at least one display element arranged on a substrate;
    a low reflection layer arranged on the display element, wherein the low reflection layer comprises inorganic material;
    an encapsulation layer arranged on the low reflection layer, wherein the encapsulation layer comprises a pigment and a first organic material; and
    a reflection adjusting layer arranged on the encapsulation layer, wherein the reflection adjusting layer comprises a dye and a second organic material.

2. The display apparatus of claim 1, wherein the pigment is included in the encapsulation layer and is not included in the reflection adjusting layer.

3. The display apparatus of claim 1, wherein the pigment is insoluble in the first organic material.

4. The display apparatus of claim 3, wherein the first organic material comprises a base polymer having at least one of an acrylate group and an epoxy group.

5. The display apparatus of claim 3, wherein the pigment comprises at least one of C.I Pigment Red 177, C.I Pigment Green 7, C.I Pigment Green 59, C.I Pigment Yellow 185, and C.I Pigment Blue 15:6.

6. The display apparatus of claim 2, wherein the dye is included in the reflection adjusting layer and not included in the encapsulation layer.

7. The display apparatus of claim 1, wherein the dye is soluble in the second organic material.

8. The display apparatus of claim 1, wherein the inorganic material comprises at least one of ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), and zinc (Zn), germanium (Ge).

9. The display apparatus of claim 1, wherein
    the at least one display element includes a plurality of display elements, and
    the low reflection layer is patterned to respectively correspond to the plurality of display elements.

10. The display apparatus of claim 1, wherein the encapsulation layer comprises:
    at least one inorganic encapsulation layer; and
    at least one organic encapsulation layer comprising the pigment and the first organic material.

11. The display apparatus of claim 1, wherein the encapsulation layer comprises:
   an encapsulation substrate; and
   a filling material comprising the pigment and the first organic material.

12. The display apparatus of claim 1, wherein the reflection adjusting layer absorbs light in at least two wavelength regions among a first wavelength region, a second wavelength region, a third wavelength region, and a fourth wavelength region, each having a different wavelength band.

13. The display apparatus of claim 12, wherein
   the first wavelength region is in a range of about 350 nm to about 430 nm,
   the second wavelength region is in a range of about 480 nm to about 510 nm,
   the third wavelength region is in a range of about 575 nm to about 605 nm, and
   the fourth wavelength region is in a range of about 650 nm to about 700 nm.

14. The display apparatus of claim 13, wherein the reflection adjusting layer absorbs light in the second wavelength region and light in the third wavelength region.

15. The display apparatus of claim 12, wherein the reflection adjusting layer comprises:
   at least two dyes among a first dye absorbing light in the first wavelength region, a second dye absorbing light in the second wavelength region, a third dye absorbing light in the third wavelength region, and a fourth dye absorbing light in the fourth wavelength region.

16. The display apparatus of claim 15, wherein the first dye comprises at least one of a metal porphyrin compound, a methine compound, and a triazine compound.

17. The display apparatus of claim 15, wherein the second dye comprises a pyrromethene compound.

18. The display apparatus of claim 15, wherein the third dye comprises a tetra-azaporphyrin compound.

19. The display apparatus of claim 15, wherein the fourth dye comprises a phthalocyanine compound.

20. The display apparatus of claim 15, wherein an amount of each of the dyes in the reflection adjusting layer is in a range of about 0.005 wt % to about 0.5 wt %.

* * * * *